(12) United States Patent
Gupta

(10) Patent No.: US 12,021,029 B2
(45) Date of Patent: *Jun. 25, 2024

(54) SYSTEMS, METHODS, AND APPARATUSES FOR AN ARRAY OF DEVICES

(71) Applicant: Sandeep Kumar Gupta, Sunny Isles Beach, FL (US)

(72) Inventor: Sandeep Kumar Gupta, Sunny Isles Beach, FL (US)

(73) Assignee: ZetaGig Inc., Sunny Isles Beach, FL (US)

( * ) Notice: Subject to any disclaimer, the term of this patent is extended or adjusted under 35 U.S.C. 154(b) by 350 days.

This patent is subject to a terminal disclaimer.

(21) Appl. No.: 17/676,761

(22) Filed: Feb. 21, 2022

(65) Prior Publication Data

US 2023/0260907 A1 Aug. 17, 2023

Related U.S. Application Data

(63) Continuation-in-part of application No. 17/672,686, filed on Feb. 16, 2022, now Pat. No. 11,953,963.

(51) Int. Cl.
*G06F 1/18* (2006.01)
*H01L 23/528* (2006.01)

(52) U.S. Cl.
CPC .......... *H01L 23/5286* (2013.01); *G06F 1/189* (2013.01)

(58) Field of Classification Search
None
See application file for complete search history.

(56) References Cited

U.S. PATENT DOCUMENTS 5,067,003 A 11/1991 Okamura
5,581,506 A 12/1996 Yamauchi
(Continued)

FOREIGN PATENT DOCUMENTS

CN 105045362 A 11/2015
WO WO2017012371 A1 1/2017

OTHER PUBLICATIONS

PCT/US 23/62021; Notification of Transmittal of the International Search Report and the Written Opinion of the International Searching Authority, or the Declaration, Dated Feb. 6, 2023.
(Continued)

*Primary Examiner* — Thomas J. Hiltunen
(74) *Attorney, Agent, or Firm* — Brian R. Short

(57) ABSTRACT

Apparatuses, methods, and systems for power supply stacking of an array of devices are disclosed. For an embodiment, each device is specified by a location (i,j), each device includes a Vdd terminal, and a Vss terminal, at least a plurality of the devices further including at least one other $V\_Ter_z$ terminal. For an embodiment, the Vss terminal of the device at location (i,j), for i=2:N, j=1:M, is connected to the Vdd terminal of the device at location (i−1,j) resulting in a voltage between the Vdd and Vss terminals of at least a majority of the devices in the array to be a substantially same voltage VDD, wherein the potential of the Vss terminal of the each device at any location (i,j+1) is generated to be higher than the potential of the Vss terminal for another device at location (i,j) by a voltage $X_j$, for i=1:N, j=1:M−1.

22 Claims, 6 Drawing Sheets

(56) References Cited

U.S. PATENT DOCUMENTS

Figure 1:
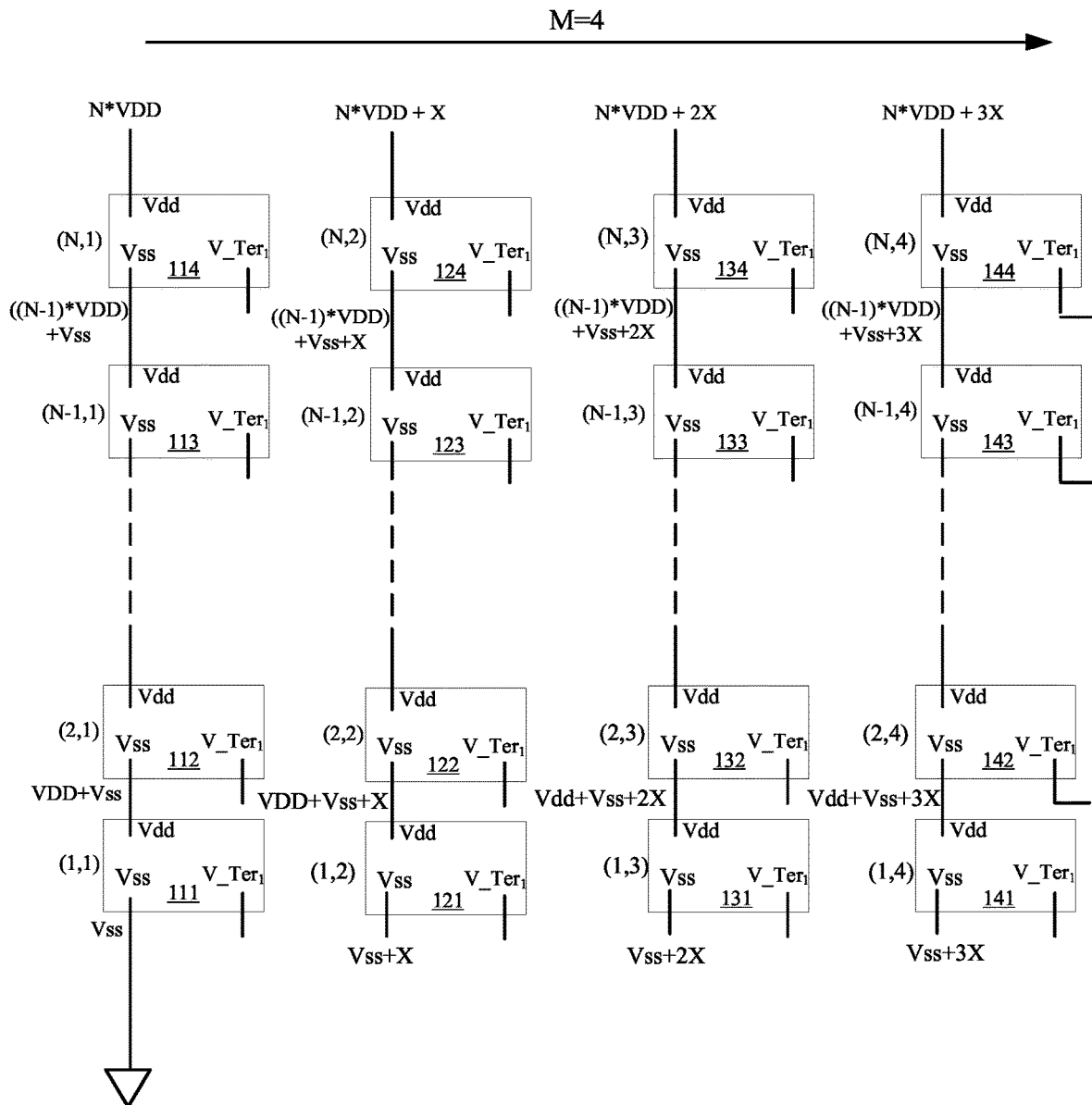

| | | | |
|---|---|---|---|
| 5,867,040 | A | 2/1999 | Fuse et al. |
| 6,552,581 | B1 | 4/2003 | Gabara |
| 7,187,069 | B2 | 3/2007 | Uematsu et al. |
| 7,683,673 | B2 * | 3/2010 | Fensore .................. H03F 3/24 |
| | | | 327/210 |
| 8,878,387 | B1 | 11/2014 | Wong et al. |
| 8,884,662 | B2 | 11/2014 | Ancis et al. |
| 9,459,646 | B2 * | 10/2016 | Tan .......................... G05F 3/262 |
| 9,954,527 | B2 | 4/2018 | Wilson et al. |
| 11,641,200 | B2 | 5/2023 | Hossain et al. |
| 11,669,135 | B2 | 6/2023 | Tiruvuru et al. |
| 11,687,148 | B1 | 6/2023 | Montoye et al. |
| 2009/0051163 | A1 | 2/2009 | Lili et al. |
| 2009/0051639 | A1 | 2/2009 | Liu |
| 2013/0135944 | A1 | 5/2013 | Braceras et al. |
| 2016/0054746 | A1 | 2/2016 | Thakur |
| 2017/0316751 | A1 | 11/2017 | Wang |
| 2019/0221181 | A1 | 7/2019 | Li et al. |
| 2020/0125693 | A1 | 4/2020 | Frederick, Jr. |
| 2023/0261001 | A1 | 8/2023 | Gupta |
| 2023/0261656 | A1 | 8/2023 | Gupta |
| 2023/0261659 | A1 | 8/2023 | Gupta |

OTHER PUBLICATIONS

Voltage-Stacked Power Delivery Systems: Reliability, Efficiency, and Power; An Zou, Student Member, IEEE, Jingwen Leng, Xin He, Member, IEEE, Yazhou Zu, Christopher D. Gill, Senior Member, IEEE, Vijay Janapa Reddi, Xuan Zhang, Member, IEEE; Journal of Latex Class Files, vol. 14, No. 8, Aug. 2015.

Voltage-Stacked GPUs: A Control Theory Driven Cross-Layer Solution for Practical Voltage Stacking in GPUs; An Zou, Jingwen Leng, Xin He, Yazhou Zu, Christopher D. Gill, Vijay Janapa Reddi, Xuan Zhang, Washington University in St. Louis, Shanghai Jiao Tong University, The University of Texas at Austin, Harvard University; 2018 51st Annual IEEE/ACM International Symposium on Microarchitecture.

* cited by examiner

SYSTEMS, METHODS, AND APPARATUSES FOR AN ARRAY OF DEVICES

RELATED APPLICATIONS

This patent application is a continuation-in-part (CIP) of U.S. patent application Ser. No. 17/672,686 filed Feb. 16, 2022, which is herein incorporated by reference.

FIELD OF THE DESCRIBED EMBODIMENTS

The described embodiments relate generally to electronic devices. More particularly, the described embodiments relate to systems, methods, and apparatuses for an array of devices.

BACKGROUND

Low power supply voltage (as low as 200 mV-500 mV) may be used for lowering power consumption associated with dynamic power dissipation in integrated circuits (ICs). Such ICs can still, however, be required to support processing of a very high number of computations that consume high power at such small voltages, thereby drawing a very high amount of current. The IR (current times resistance) drops associated with such high currents can be large due to requirements of extra routing. Further, $I^2R$ power losses associated with these currents can limit the entire advantage of such choice of low power supply voltage. As one example, it is conceivable in any ASIC (Application Specific Integrated Circuit)/Hardware implementation, that one of the ASICs running at 300 mV power supply may burn as much as 3 W, thereby taking as much as 10 A of current and high-performance compute demands may require many such ASICs (>40) in at least some hardware system implementations. It is conceivable that a regulator that regulates and generates the individual voltages of the ICs down to such low voltages would be inefficient, and then even if done, at some point when an aggregation of the current is done through the 40 different IC's would result in 10 A*40=400 A to be supplied by such regulator, resulting in any practicably implementable resistance carrying such current to have a large IR drop and large $I^2R$ power losses. Series power supply stacking of 40 IC's where grounds of successive ICs are the supplies of the IC below in the stack (column) and such ICs power supplies and grounds are all put together in series between a 12V supply would lower the current requirement out of the Voltage regulation module which only generates 12V and is now required to support a 40 times lower current. However, such series stacking in a column may not provide additional voltages or additional power saving techniques if necessary.

It is desirable to have methods, apparatuses, and systems for voltage distribution of devices of an array of devices.

SUMMARY

An embodiment includes an array of devices. For an embodiment, the array of devices includes each device within the array of devices specified by a location (i,j) within the array of devices, wherein i is a row index ranging from 1 to N, and j is a column index ranging from 1 to M, wherein M is a positive integer greater than or equal to 2 and N is a positive integer; each device including a Vdd terminal, and a Vss terminal, wherein the Vdd terminal has a higher potential than the Vss terminal. For an embodiment, at least a first plurality of the devices in the array of devices, where each device in the first plurality of the devices in the array of devices further include at least one input terminal and at least one output terminal and Zmax number of $V\_Ter_z$ terminals, where z is an index ranging from 1 to Zmax, where Zmax is a positive integer. For an embodiment, when N is greater than or equal to 2, then for at least a first majority of the devices in the array of devices, the Vss terminal of the device at location (i,j), for i=2:N, j=1:M is connected to the Vdd terminal of the device at location (i−1,j), resulting in a potential difference between the Vdd terminal and the Vss terminal of at least the first majority of the devices in the array of devices to be a substantially same voltage VDD, wherein for at least a second majority of the devices in the array of devices, the potential of the Vss terminal of each device at any location (i,j+1) of the array of devices is generated to be higher than the potential of the Vss terminal for another device at location (i,j) by a voltage $X_j$, for i=1:N, j=1:(M−1), and wherein VDD is substantially same as a potential difference between the Vdd terminal and the Vss terminal of at least one device of the first plurality of the devices in the array of devices, and a sum of all $X_j$ voltages for j=1:(M−1) is greater than or substantially same as VDD/2.

Other aspects and advantages of the described embodiments will become apparent from the following detailed description, taken in conjunction with the accompanying drawings, illustrating by way of example the principles of the described embodiments.

BRIEF DESCRIPTION OF THE DRAWINGS

FIG. 1 shows a block diagram of an array of devices that include power supply stacking and staggered voltage distribution, according to an embodiment.

FIG. 2 shows a block diagram of an array of devices that include power supply stacking and staggered voltage distribution, according to another embodiment.

FIG. 3 shows a block diagram of an array of devices that include power supply stacking and staggered voltage distribution, according to another embodiment.

FIG. 4 shows a block diagram of an array of devices that include power supply stacking and staggered voltage distribution, according to another embodiment.

FIG. 5 shows a block diagram of an array of devices that include power supply stacking and staggered voltage distribution, according to another embodiment.

FIG. 6 shows a block diagram of an array of devices that include power supply stacking and staggered voltage distribution, according to another embodiment.

DETAILED DESCRIPTION

The embodiments described include methods, apparatuses, and systems for power supply stacking and staggered voltage distribution. An embodiment includes an array of devices that include power supply stacking, according to an embodiment. For an embodiment, each device includes at least one or more of transistors or resistors or capacitors or diodes. For an embodiment, the plurality of the one or more of transistors or resistors or capacitors or diodes in the device are configured as an electrical circuit. For an embodiment, each of the devices includes a Vdd terminal and a Vss terminal, wherein the Vdd terminal has a higher potential than the Vss terminal. For an embodiment, each of the devices in the first plurality of the devices in the array of devices includes at least one input terminal and at least one output terminal and a Vdd terminal, and a Vss terminal. For an embodiment, the Vdd terminal is used to source current to the device and the Vss terminal is used to sink current from the device. For an embodiment, each of the devices may have at least one clock as one of at least one input or at least one output terminals. For an embodiment, a first plurality of the devices in the array of devices includes Zmax number of $V\_Ter_z$ terminal and where z is an index ranging from 1 to Zmax, where Zmax is a positive integer.

For an embodiment, at least a majority of the N devices, in each column j, for J=1:M, in the array of devices are substantially similar devices. For the described embodiment, term "substantially similar devices" means that the devices are substantially similar to the extent that all components of the devices are designed to be the same and the number and type of input terminals and output terminals and terminals to source and sink currents are the same on each device, but such devices may not be identical to the extent that such devices may receive different input signals and all components of such devices while designed to be the same, may not be identical at least due to different manufacturing tolerances, different temperatures, different input signals or slightly different voltages to source or sink currents. Substantially similar devices may be of different "types" that are classifications of different groups of substantially similar devices. For example: (a) Substantially similar devices of type 1 are devices that include 2 extra terminals $V\_Ter_1$ and $V\_Ter_2$ in addition to Vdd terminal and Vss terminal and other inputs and outputs terminals (b) Substantially similar devices of type 2 are devices that include 1 extra terminals $V\_Ter_1$ in addition to Vdd terminal and Vss terminal and other inputs and outputs terminals (c) Substantially similar devices of type 3 are devices that include no extra terminals for which potentials need to be generated in addition to Vdd terminal and Vss terminal and other inputs and outputs terminals. There can be many other "types" of substantially similar devices. For an embodiment, some of the columns in the array of devices have at least a majority of substantially similar devices of type 1. For an embodiment, some of the columns in the array of devices have at least a majority of substantially similar devices of type 2. For an embodiment, some of the columns in the array of devices have at least a majority of substantially similar devices of type 3. For an embodiment, some of the columns in the array of devices have at least a majority of substantially similar devices of type 1, some of the columns in the array of devices have at least a majority of substantially similar devices of type 2, some of the columns in the array of devices have at least a majority of substantially similar devices of type 3. For an embodiment all the columns in the array of devices have at least a majority of substantially similar devices of type 1. For an embodiment all the columns in the array of devices have at least a majority of substantially similar devices of type 2. A balanced voltage generation for the entire array of devices is achievable in at least some embodiments where all the columns of the entire array of devices are of one particular type and nearly all, or all of the devices in the entire array are substantially similar devices.

For an embodiment, one or more devices in the array of devices may only be a two terminal device, where in the 2 terminals may be a Vdd terminal and a Vss terminal and the 2 terminal device may include only 2 terminal elements like a resistor or diode or include one or more transistors or resistors or capacitor or diodes with their terminals connected to each other in such a way that the device were to have only 2 terminals were to result in the device. For an embodiment, the two terminal devices may be used as a minority of the devices in the array and such 2 terminal devices may be different from majority of the devices used in the array, wherein such minority two terminal devices may be used to conduct the current through their terminals Vdd and Vss to balance the voltages in one column by replacing a non-functioning other device.

FIG. 1 shows a block diagram of an array of devices 111, 112, 113, 114, 121, 122, 123, 124, 131, 132, 133, 134, 141, 142, 143, 144 that include power supply stacking, according to an embodiment. The dashed line in each column of FIG. 1 is shown to indicate that there can be more devices in each column than the ones shown. As shown, each device within the array of devices 111, 112, 113, 114, 121, 122, 123, 124, 131, 132, 133, 134, 141, 142, 143, 144 is specified by a location (i,j) within the array of devices 111, 112, 113, 114, 121, 122, 123, 124, 131, 132, 133, 134, 141, 142, 143, 144, wherein i is a row index ranging from 1 to N, and j is a column index ranging from 1 to M. For an embodiment, each device including a Vdd terminal to source current to the device, and a Vss terminal to sink current from the device, wherein the Vdd terminal has a higher potential than the Vss terminal. For an embodiment, $V\_Ter_z$ terminals, for z=1: Zmax can be used to source current to the device or to sink current from the device or could be a reference voltage to the device.

The description "plurality of the devices" implies at least 2 or more devices. For an embodiment, the first plurality of the devices may be all devices in a column. For an embodiment, the first plurality may be all devices in the entire array. FIG. 1 shows an embodiment where the first plurality includes all the devices in the array of devices that are further substantially similar devices of type 2. FIG. 1 shows an embodiment where M=4, Zmax=1, N>2. FIG. 1 shows an embodiment where the voltage $X_j$ between each column j and (j+1) is same as X.

It is to be understood that "potential" and "electric potential" are interchangeably used as meaning the electric potential of any node or terminal in the electrical circuit; and voltage is the potential difference between 2 nodes or terminals of an electrical circuit, but if some node or terminal is referred to have a voltage, it is meant to be the potential difference between that node or terminal and 0.

For an embodiment, when N is greater than 2, then for at least a first majority of the devices in the array of device, the Vss terminal of the device at location (i,j), for i=2:N, j=1:M is connected to the Vdd terminal of the device at location (i−1,j) resulting in a substantially same voltage VDD as a potential difference between the Vdd terminal and the Vss terminal of at least the first majority of the devices in the array of devices. For an embodiment, the first majority includes at least greater than 50% of the devices in the array of devices that have greater than 50% of the (N−1)*M described connections between Vss terminal of devices at location (i,j) to Vdd terminal of devices at location (i,j−1) for i=2:N, j=1:M. For an embodiment, the substantially same voltage VDD across all devices Vdd and Vss terminal may be achieved if nearly, or all of the described connections are made for all of the devices in the entire column of the array. The first majority therefore may include all of the devices in the array in an embodiment.

For an embodiment, for at least a second majority of the devices in the array of devices, the potential of the Vss terminal of the each device at any location (i,j+1) of the array of devices is generated to be higher than the potential of the Vss terminal for another device at location (i,j) by a voltage $X_j$, for i=1:N, j=1:(M−1), sum of all $X_j$ voltages for j=1:(M−1) is greater than or substantially same as VDD/2. For at least some embodiments, the sum of all $X_j$ voltages for $j=1:(M-1)$ is also less than or substantially same as VDD, wherein VDD is substantially the same as a potential difference between the Vdd terminal and the Vss terminal of the second majority of devices in the array of devices. For at least some embodiments, wherein all of the $X_j$ voltages are equal to X, the most balanced operation of the array of devices may be when X is such that $M*X-VDD=0$. For at least some embodiments, $(M*X-VDD)$ is designed to be in a voltage range of $(-X/2, X/2)$ (especially if not possible to ensure $(M*X-VDD)=0$), and in some embodiments, if not possible to ensure that, then $(M-1)*X$ may be kept substantially same as VDD.

For the described embodiments referencing potentials of Vdd terminal, it is to be understood that the potentials of a Vdd terminal or a Vss terminal of any device while desired to be constant, may vary as a function of signal or noise, due to non-zero impedance at the Vdd terminal or the Vss terminal, and the difference of the potential of the Vdd terminal and the Vss terminal that defines the VDD of the at least one device may also vary so references to Vdd or Vss terminal potentials or VDD may imply the average desired value of potential of the Vdd terminal and average desired value of potential of the Vss terminal or VDD.

For at least some embodiments, at least one of a $V\_Ter_z$ terminal of a first device in the first plurality of the devices is connected to one of a Vss terminal or a Vdd terminal of a second device in the first plurality of the devices, and at least one of a $V\_Ter_z$ terminal of the second device is connected to a Vss terminal or a Vdd terminal of at least one of the first device or a different device in the array of devices.

For at least some embodiments, at least one of a $V\_Ter_z$ terminal or an input terminal or an output terminal of a first device in the first plurality of the devices is connected to at least one of a Vss terminal or a Vdd terminal or an input terminal or an output terminal of a second device in the first plurality of the devices, and at least one of a $V\_Ter_z$ terminal or an input terminal or an output terminal of the second device is connected to at least one of a Vss terminal or a Vdd terminal or an input terminal or an output terminal of at least one of the first device or a different device in the array of devices.

When in the described embodiments, reference is made to "wherein at least one of a $V\_Ter_z$ terminal of a first device in the first plurality of the devices is connected to one of a Vss terminal or a Vdd terminal of a second device in the first plurality of the devices, and at least one of a $V\_Ter_z$ terminal of the second device is connected to a Vss terminal or a Vdd terminal of at least one of the first device or a different device in the array of devices", it is to be understood that the first device and the second device and the different device can be in any location in the array of devices and the connections of the described embodiments may be done for one or more other devices in the array of devices. When in the described embodiments, reference is made to "wherein at least one of a $V\_Ter_z$ terminal or an input terminal or an output terminal of a first device in the first plurality of the devices is connected to one of a Vss terminal or a Vdd terminal or an input terminal or an output terminal of a second device in the first plurality of the devices, and at least one of a $V\_Ter_z$ terminal or an input terminal or an output terminal of the second device is connected to a Vss terminal or a Vdd terminal or an input terminal or an output terminal of at least one of the first device or a different device in the array of devices", it is to be understood that the first device and the second device and the different device can be in any location in the array of devices and the connections of the described embodiments may be done for one or more other devices in the array of devices. For at least some of the described embodiments, the $V\_Ter_z$ terminals are connected to Vss or Vdd to generate the voltages for $V\_Ter_z$ and also provide balanced currents to each of the $V\_Ter_z$ terminals. For at least some of the embodiments, $V\_Ter_z$ may represent a reduced supply terminal to source current and for at least some of the embodiments, $V\_Ter_z$ may represent a raised ground terminal to sink current and for at least some of the embodiments, $V\_Ter_z$ may represent a reference static voltage and in such embodiments, $V\_Ter_z$ may be connected to either the Vdd or Vss terminals of other devices in the array of devices, and each of the staggered voltage $X_j$ for $j=1:(M-1)$ is designed to be constant voltage, wherein for the embodiments shown in FIGS. 1-6 the staggered voltages $X_j$ for $j=1:(M-1)$ are all designed to be a same voltage X. For at least some of the embodiments $V\_Ter_z$ may also represent signals which may be static or even dynamic in nature and in such embodiments, $V\_Ter_z$ or other input or output signals of the devices may be connected to input or output terminals of the devices to share information across devices for use amongst devices that have staggered voltages developed across them by the voltage dropping elements along the columns of the devices and some of the staggered voltages $X_j$ for $j=1:(M-1)$, may be designed to be variable voltages.

For an embodiment, the potentials of each of the $V\_Ter_z$ terminals of each of the devices in the first plurality of the devices at location (i,j) in the array of devices is generated by the array of devices by connecting these $V\_Ter_z$ terminals to the Vdd terminal or the Vss terminal of different devices in the array of devices that are in the same row i but different column $j+C(z)$ or $j-C(z)$, where $C(z)$ for $z=1:Zmax$, are Zmax positive integers, (where Zmax is also a positive integer greater than or equal to 1).

Figure 4:
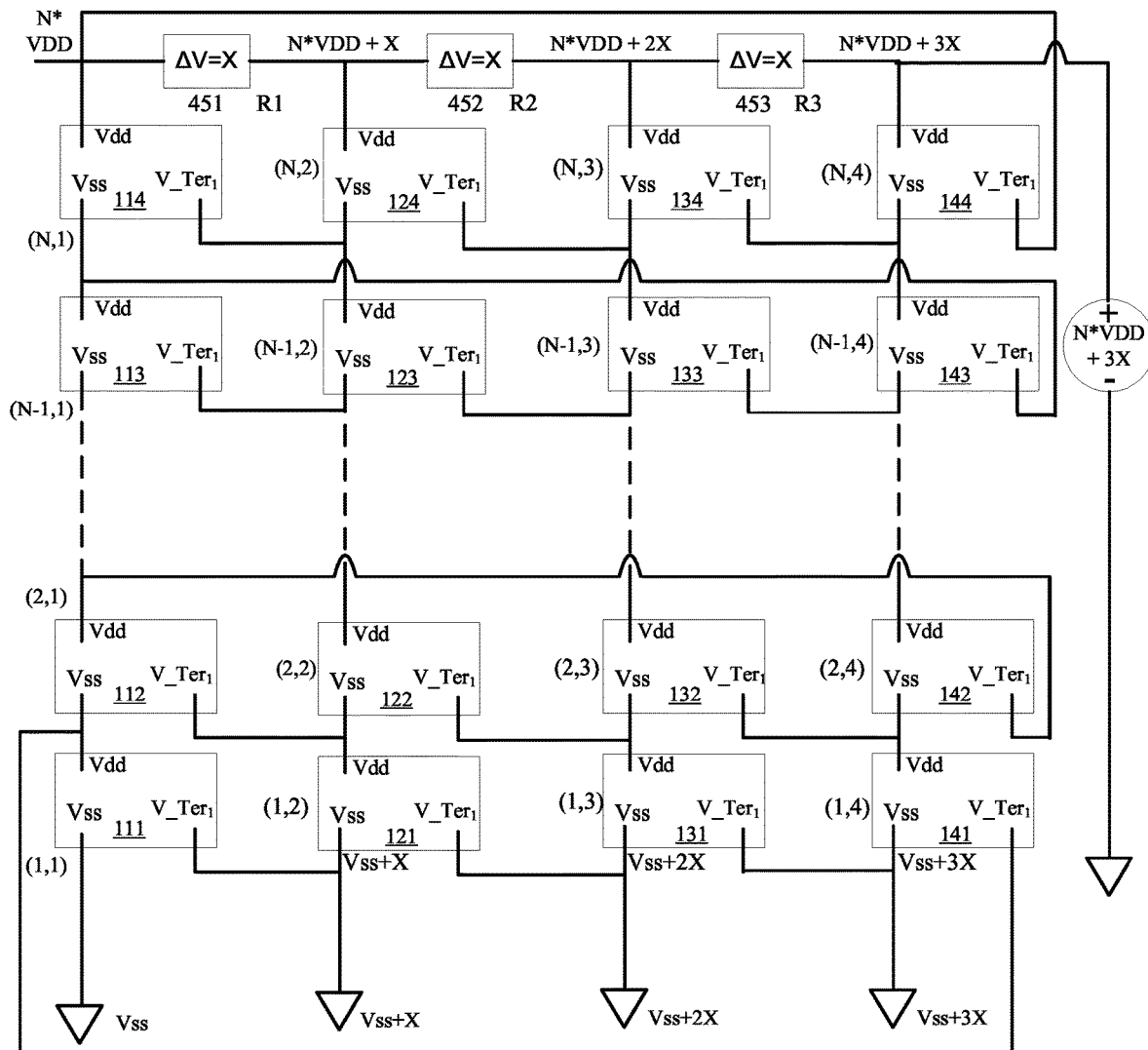
Figure 5:
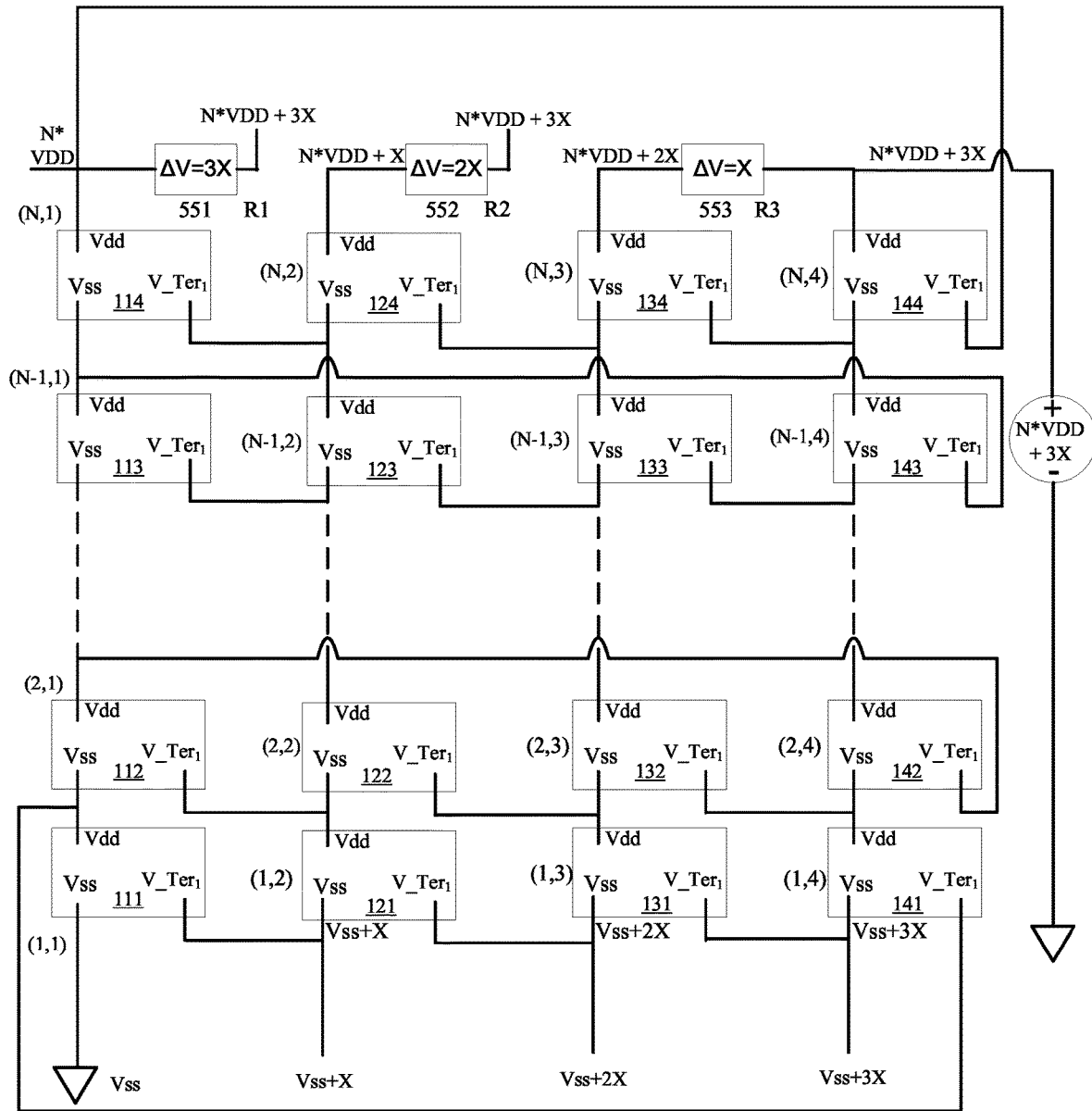
Figure 6:
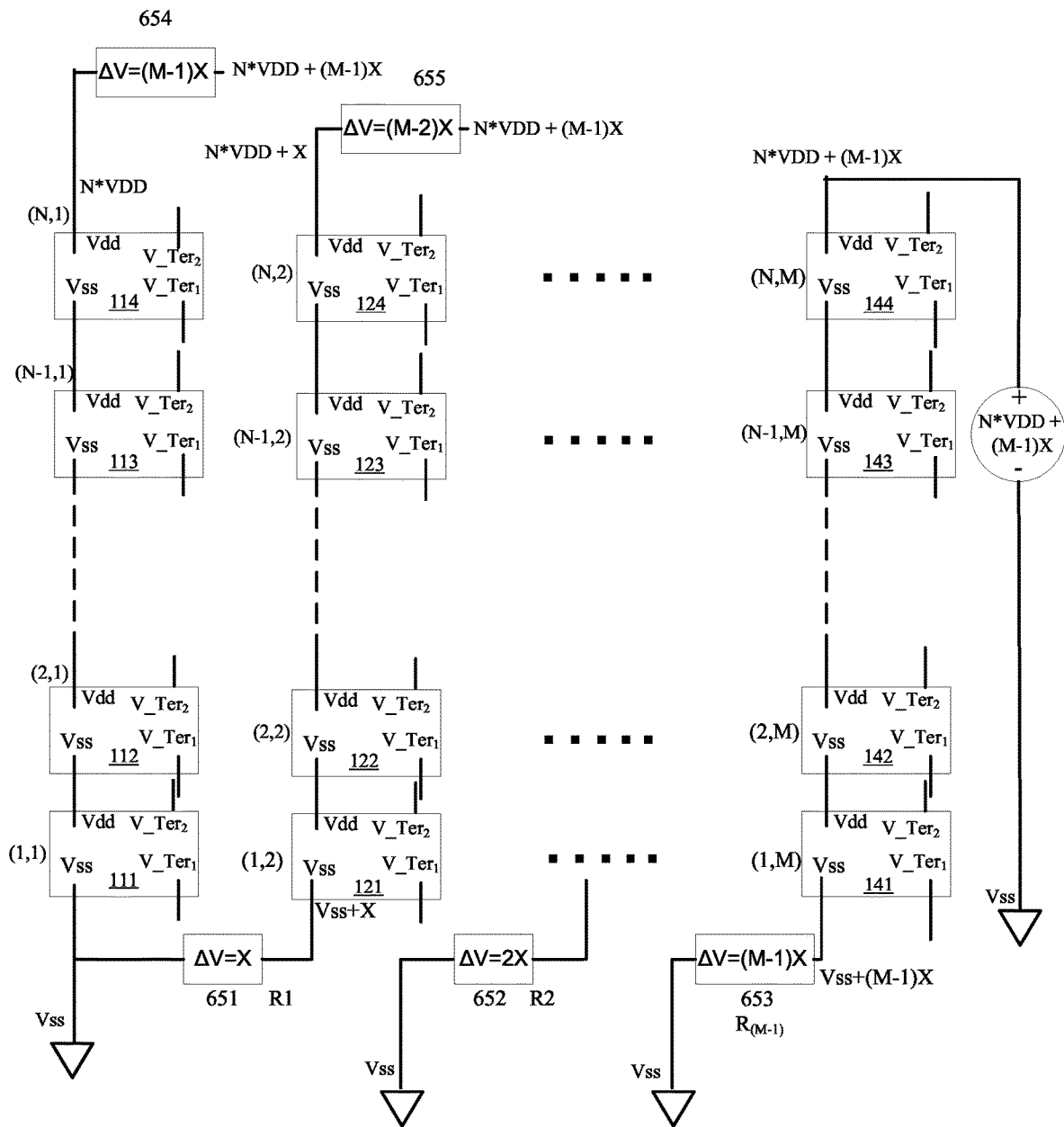

More than one of the connections of $V\_Ter_z$ terminals are shown in the embodiments of FIGS. 2-5. FIGS. 1-5 show embodiments with simplified values of the various parameters, wherein M=4, Zmax=1, C(1)=1 (for z=1), all $X_j$ for $j=1:M-1$ are shown to be the same as a potential X. In FIG. 6, M>2, N>2, Zmax=2, C(1) and C(2) are not depicted as the connections for $V\_Ter_z$ are not shown in the FIG. 6.

For at least some embodiments, the second majority refers to at least a greater than 50% of the devices and that may be same or different than the first majority in some embodiments and may include all of the devices in the array in some embodiments. For an embodiment, wherein Zmax=1, and only 1 $V\_Ter_1$ terminal is to be connected, and C(1)=1, then each of the voltages $X_j$ may be a substantially same voltage X that may be chosen to be the smaller of (a) the difference between the potential of the $V\_Ter_1$ terminal and Vss terminal or (b) the difference between the potential of the Vdd terminal and the $V\_Ter_1$ terminal.

For an embodiment, each of the $X_j$ voltages for $j=1:(M-1)$ are such that the sum of all $X_j$ voltages for $j=1:(M-1)$ is greater than or substantially same as VDD/2 and less than or substantially same as VDD. For an embodiment when M=2, there is only one $X_j$ voltage that is $X_1$ and that is kept "substantially the same" or "substantially same" as VDD/2. When the described embodiments reference "substantially the same" or "substantially same", it is understood that practically it is not possible to have exact voltages as desired or designed, and therefore "substantially the same voltage" or "substantially same voltage" of the described embodiments is meant to be a voltage that is desired and designed to be the named voltage (in this above embodiment by way of example VDD/2 or VDD as referenced) by the connections described, in the absence of any practical undesirable manufacturing deviations or temperature differences or any other practical non-ideal effects of implementation including but not limited to I*R drops (either due to current variations in I or due to non-ideal resistance of interconnect) that cause either each of such designed voltages to differ from desired voltage.

The embodiment of FIG. 1 shows only the Vdd, Vss and only one of the many possible extra voltages $V\_Ter_1$ to be generated. For the embodiment shown in FIG. 1, the first plurality of devices with extra $V\_Ter_1$ terminal includes all the devices in the array. In at least some embodiments, the first plurality of devices may include several $V\_Ter_z$ terminal potentials that represent one or more of raised Vss voltages or one or more reduced Vdd voltages or one or more reference voltages as may be desired on any device with a smaller step granularity compared to VDD. In some embodiments, also each device includes of input(s) and output(s) to perform intended functions and likely at least have at least one clock source and other signals as part of input(s) and output(s) but such input(s) and output(s) and clock(s) are not shown in the FIG. 1-6 for clarity.

For an embodiment, when N is greater than 2, then for each of the devices in the array, the Vss terminal of the device at location (i,j), for i=2:N, j=1:M, is connected to the Vdd terminal of the device at location (i−1,j), and each device in the entire column is substantially similar, and the potential difference between the Vdd terminal of device at location (N,j) and Vss terminal of device at location (1,j), for j=1:M, is N*VDD (* denoting a multiplication operation), then each device has a difference in potential between Vdd terminal and Vss terminal of a desired potential of VDD. Observation of FIG. 1 suggests that equal voltage division is achieved for each of the devices by the connections described previously between Vdd and Vss terminals in any column j for a balanced operation wherein in one embodiment all the connections described are made. However, in practice VDD may be slightly different for each device than the desired VDD at least due to manufacturing deviations of each device or at least due to different input vectors causing each device impedance to be slightly different and therefore the voltage drops across each device to be slightly different. The word "substantially same voltage" of the described embodiments is meant to be a voltage that is desired and designed to be the same voltage by the connections described, in the absence of any practical undesirable manufacturing deviations or difference in input vectors or temperature differences or any other practical non-ideal effects of implementation that cause either each of such designed device voltages between Vdd terminal and Vss terminal to differ from the desired VDD voltage, or if all of $X_j$ voltages in an embodiment are designed to be the same the difference in Vss Terminals between devices (i,j) to (i,j−1) to differ from desired substantially same voltage X, (or in staggered 3 dimensional array embodiment from desired voltage W, if all of Wj voltages in an embodiment are designed to be the same). For at least some embodiments, the differences of the potential difference between Vdd terminal and Vss terminal from the desired VDD can be adjusted by adjusting input vectors and/or input clock frequency as among a few exemplary parameters. This is because for at least some embodiments, changing input vectors or input clock frequency changes the impedance of the device and therefore if any non-idealities like manufacturing deviations or other sources of non-idealities were responsible for difference in impedances of the devices to begin with causing such different than VDD drops across them, then such adjustment of impedances of the device through input vectors or clock frequency can compensate for it. At least some of the described embodiments as shown in FIGS. 1-6 include generating one or more of $V\_Ter_z$ terminal potentials by generating voltage staggered columns that have a smaller step granularity X than VDD. For the embodiments of FIGS. 1-6, the $X_j$ voltages are chosen to be a substantially same voltage X as an embodiment, but such voltages $X_j$ can be different in other embodiments. Note: the voltage drop between Vss of each device (i,j) compared to nearby column device (i,j+1) for i=1:N and j=1:M−1, is different by X so staggered voltages are generated in the array of devices in the embodiments shown in FIGS. 1-6.

For an embodiment, the voltages $X_j$ for j=1:(M−1) are generated by at least (M−1) voltage dropping elements ($R_j$), wherein each of the voltage dropping elements ($R_j$) have at least 2 terminals Rx1 and Rx2, and wherein each of the voltage dropping elements ($R_j$) facilitating a potential drop across the Rx1 terminal and the Rx2 terminal are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

For at least some embodiments, a voltage level shifting buffer may be realized by an active circuit including of one or more of transistors or even a combination of passive devices, such as, diodes or resistors or capacitors. For various embodiments, when the described embodiments reference that a potential of any terminal in an array is "generated" to be higher than potential of any other terminal in the array, or when it is referenced that the voltages $X_j$ for j=1:(M−1) are generated, the generation assumes at least one or more of the following (a) current being passed through the voltage dropping elements which when multiplied by the "effective" resistance of the voltage dropping element generates those voltages $X_j$ or potential differences in the array or (b) the presence of voltage battery or voltage level shifting buffer, which generates the voltage $X_j$ or potential differences in the array. For the described embodiments, when referenced to $R_j$ being implemented as a "switched capacitor circuit that functionally behaves as a resistor", that may include any $R_j$ implementation done with an active device that includes a combination of transistors and/or resistors and/or capacitors and/or diodes and is clocked to function as a switched capacitor resistor. For at least some embodiments, especially when the voltage drop across the voltage dropping element $R_j$ is large or comparable to a device in the array of devices, the reference to $R_j$ being implemented as a "switched capacitor circuit that functionally behaves as a resistor" may therefore include a device similar or substantially similar to a device from the array of devices that can be configured as a switched capacitor resistor to function as a voltage dropping element $R_j$. For at least some embodiments, it is understood that $R_j$ if implement as a trace or routing wire resistance may be very low valued.

For several embodiments the at least (M−1) voltage dropping elements can be implemented in various different rows of the array of devices in various different ways, to achieve voltage drops across them so that the potential of the Vss terminal of each device at any location (i,j+1) of the array of devices is generated to be higher than the potential of the Vss terminal for another device at location (i,j) by a voltage $X_j$, for i=1:N, j=1:(M−1). For several embodiments there may be 2*(M−1) voltage dropping elements implemented in 2 different rows in the array of devices.

For an embodiment, wherein for j=1:M−1, the Rx1 terminal of voltage dropping elements $R_j$ is connected to the Vss terminal of the device at location (1,j+1) in the array of devices, and the Rx2 terminal of $R_j$ is connected to the Vss terminal of one of the j devices at j locations in row 1 from (1,1) to (1,j) in the array of devices.

The described embodiments show that there are very large number of ways, possibly factorial (M−1)=((M−1)* (M−2)* . . . 2*1) ways, to connect the $R_j$ voltage dropping elements across row 1 to allow a Direct Current (DC) path from each of the Vss terminals of devices at locations (1,j) to Vss terminal of the device at location (1,1), and this is because the device at any location (j+1) in row 1 has j different lower potential nodes to connect to, to find a DC path to Vss at location (1,1). It is to be noted that in various embodiments, all the potentials in the array are referred to the potential of the Vss terminal at location (1,1) that is connected to a lower potential terminal of a power supply with voltage N*VDD+(M−1)*X.

For an embodiment, wherein for j=1:M−1, the Rx1 and Rx2 terminals of the voltage dropping elements $R_j$ are connected to the Vss terminals of the devices at locations (1,j+1) and (1,j) in the array of devices.

Figure 2:
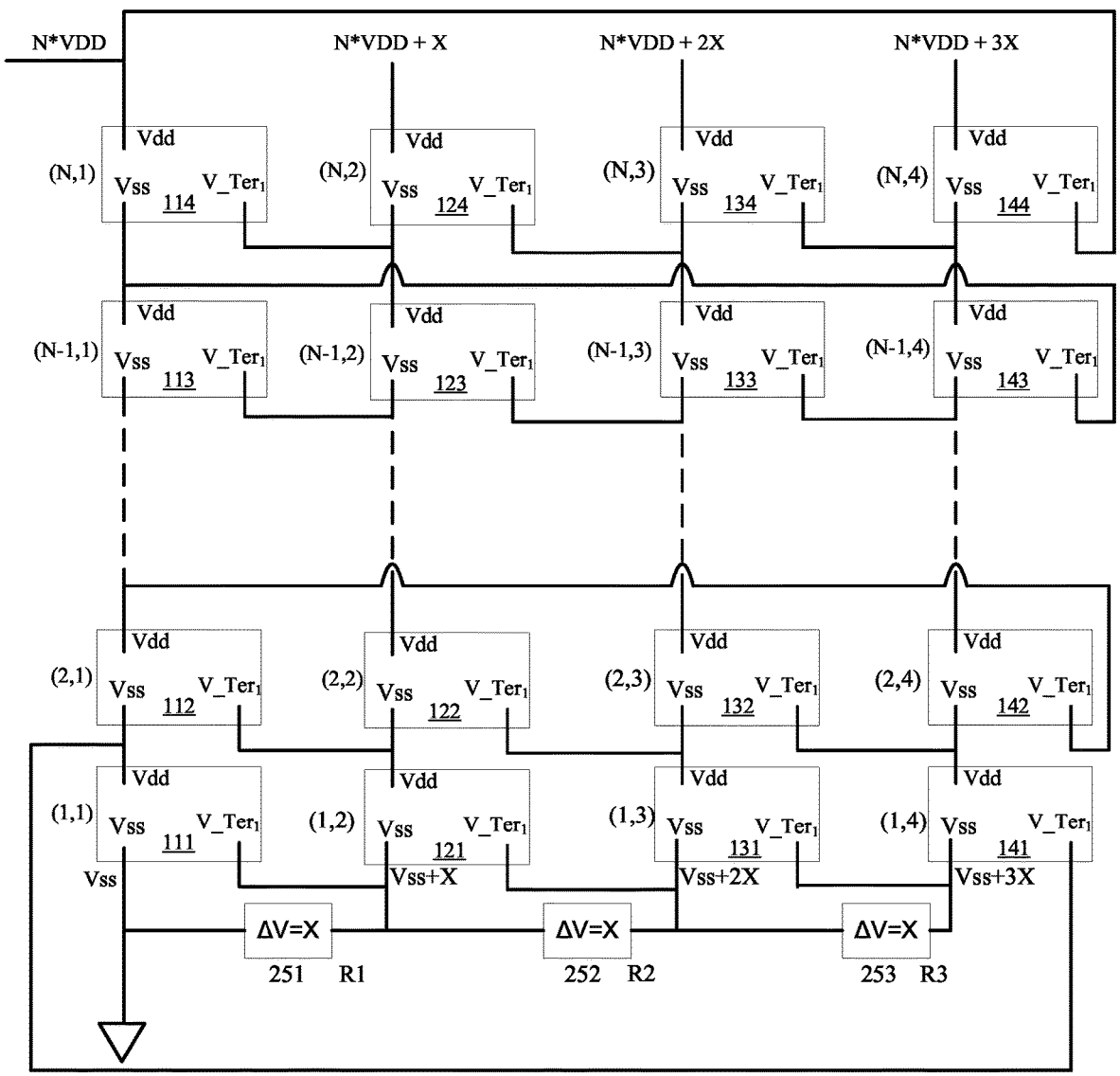

In the described embodiments, the series connections of voltage dropping elements is chosen as one possible way to connect, as shown in FIG. 2.

FIG. 2 shows a block diagram of an array of devices 111, 112, 113, 114, 121, 122, 123, 124, 131, 132, 133, 134, 141, 142, 143, 144 that include power supply stacking, according to an embodiment. The dashed line convention in the column is shown in the FIG. 2 to indicate that there could be more devices in each column than the devices shown. As shown, each device within the array of devices 111, 112, 113, 114, 121, 122, 123, 124, 131, 132, 133, 134, 141, 142, 143, 144 is specified by a location (i,j) within the array of devices 111, 112, 113, 114, 121, 122, 123, 124, 131, 132, 133, 134, 141, 142, 143, 144, wherein i is a row index ranging from 1 to N, and j is a column index ranging from 1 to M. For an embodiment, each device includes a Vdd terminal to source current to the device, and a Vss terminal to sink current from the device, wherein the Vdd terminal has a higher potential than the Vss terminal. For an embodiment, at least a first plurality of the devices in the array of devices further include $V\_Ter_z$ terminals, wherein the $V\_Ter_z$ terminals can be used to source current to the device or to sink current from the device or can be a reference voltage to the device. As shown, in an embodiment, the devices 251, 252, 253 are voltage dropping elements that implement the voltage drop X as in the embodiment shown in this FIG. 2, all the $X_j$ are the same as X between the columns of the array of devices and they are disposed between Vss terminals of devices in row 1 of the array.

Voltage dropping elements 251, 252, 253 are shown in FIG. 2 between all the Vss terminals of the devices on the row 1, where in general for any M, such (M−1) voltage dropping elements across row 1 are between Vss terminals of all columns j and j+1 where j=1=M−1. For this embodiment shown in FIG. 1, M=4, Zmax=1, C(1)=1 (for z=1), all $X_j$ for j=1:M−1 are shown to be the same as a potential X. For this embodiment, a sum of all currents conducted through each column j+1:M of the plurality of devices is conducted through $R_j$, and therefore, the value of the voltage dropping element $R_j=X/(sum(I_{j+1}:I_M))$ for j=1:M−1 where $I_j$ represents the current through the column j, and the notation of function sum( ) indicates the summation of all elements contained within the parenthesis of the function sum( ). In such an embodiment, substantially same voltage difference of X between the Vss Terminals (and also between the Vdd Terminals) of devices (i,j) and (i,j+1) is created for j=1:M−1, for all other rows 2:N as well, if a substantially equal voltage division of VDD were to happen throughout the devices in any given column j.

The generation of the voltage drop $X_j$ between potentials of Vss (or correspondingly Vdd in case of balanced array) terminals of devices (i,j+1) in column j+1 to devices (i,j) in column j can alternatively be achieved in many different ways according to various different embodiments. When the voltage dropping elements are implemented in 1 row, the voltage dropping elements can be disposed to pass through either cumulative current of all higher numbered columns as shown in the embodiment of FIG. 2 or pass through current of an individual column (as will be discussed in the embodiment shown in FIG. 3), or by possibly one of factorial (M−1) combinations not possible to depict in the embodiments shown in FIGS. 2-3. In some embodiments, 2 rows of M−1 voltage dropping elements in row 1 and row N (or 2*(M−1) voltage dropping elements) may be used, especially if only 1 power source of voltage N*VDD+(M−1)*X or higher, is used for generating the voltages of the entire array of devices (including the N*VDD voltages needed across each column in the array of devices), by connecting such 1 power source higher potential terminal to the Vdd terminal of device at location (N,M) and the lower potential terminal to the Vss terminal of the devices at location (1,1). However in other embodiments where the higher potential terminal of M power sources of varying voltages N*VDD+(j−1)*X, are used to provide the Vdd terminal voltages of the devices in column j, for j=1:M in row N, and the lower potential terminal of such M power sources is connected to Vss terminal of (1,1), then such (M−1) voltage dropping elements may be used only in row 1.

For an embodiment, when the voltage dropping elements are implemented in row 1, the different $X_j$ voltages for j=1:(M−1) are chosen to be a substantially same voltage X and the highest supply voltage for row N, N*VDD+(j−1)X in any column j, for j=1:M can be generated individually through many different mechanisms in different embodiments and therefore not shown in the Figures. However, the FIGS. 4 and 5 show only 1 exemplary embodiment (b) for generating the N*VDD+(j−1)*X voltages for columns j. The three exemplary embodiments include (a) embodiments, where M different power supply sources (for example Voltage Regulator provided power supplies) with voltages N*VDD+(j−1)X, for j=1:M, supply each columns highest power supply voltage connected to Vdd terminal in row N for column j and the lower potential of such M different power supply sources is connected to Vss terminal of device (1,1), or (b) embodiments, where only 1 power supply N*VDD+(M−1)X at column M is used and a mechanism is devised to derive the individual highest voltages of Vdd Terminal of each column N*VDD+(j−1)*X where j=1:M, from that highest voltage N*VDD+(M−1)X by implementing additional (M−1) voltage dropping elements across row N between all columns j and j+1 where j=1:M−1, or (c) embodiments, where some intermediate number Y, where Y is between 1 and M, of power supply sources (for example Voltage Regulated provided power supplies) are used to supply the Vdd terminal of Y columns of devices in row N, with desired voltage of N*VDD+(j−1)X for j=1:M for those Y columns, and where each of the remaining voltages N*VDD+(j−1)X for j=1:M that are not directly provided by such Y power sources are generated by placing voltage dropping elements between the terminals that are connected directly to the Y power sources, wherein the lower potential of such Y different power sources is connected to Vss terminal of device (1,1). In the embodiment described in (a) it may be difficult to generate all of the M different staggered voltages $N*VDD+(j-1)*X$ for $j=1:M$ in the entire array from different Voltage Regulated power supplies with a degree of accuracy to generate the desired staggered voltage X between the columns of the array. This is because for the embodiment described in (a) if the desired difference in each of the M Voltage Regulated Power supplies with individual voltages $N*VDD+(j-1)*X$ is only a voltage of X, and if there is a tolerance (+−T %, where T % is usually at least 3% in practice) in the realization of the individual voltages $N*VDD+(j-1)*X$ from Regulated power supplies, then if X is less than or even comparable to $T\%*(N*VDD+(j-1)*X)$ then a loss of desired staggered voltages in the array may happen for certain values of T, N, VDD and X. If $T\%*(N+1)*VDD>VDD/2$, then in an embodiment described in (b) above, only 1 power source for the entire N*M array at row N may be used to allow staggered voltages X between columns, depending on values of T %, N, VDD and the accuracy desired on the generation of X.

For the embodiments shown in FIG. 4 and FIG. 5, it is shown that the power supplies for the highest voltage for each individual column j with staggered different voltages $(N*VDD+(j-1)*X)$ can be generated in a balanced way by a single Voltage Regulated Power supply (or multiple Voltage Regulated Power Supply in parallel) with two terminals having a potential difference of $N*VDD+(M-1)*X$ for column M, which therefore can supply the entire array which reduces the need for Voltage Regulation Supplies for each individual column. In an embodiment, controlling the voltage dropping elements externally, if such voltage dropping elements have inputs to control the resistance or voltage across such elements, or choosing appropriate values of voltage dropping elements such inaccuracies in staggered voltages $(N*VDD+(j-1)*X)$, if realized from single power supply source of voltage of $N*VDD+(M-1)*X$ or higher, may be minimized. It is also anticipated here in such embodiments that such Voltage Dropping elements while if controlled can provide accuracy in voltage may not result in low impedance at source points $N*VDD+(j-1)*X$. Also, it is anticipated that the aggregation of current of the entire array through a single Regulated Power supply Source may result in large I*R drops wherever such current is routed through in such embodiments. Therefore in other embodiments stated in (c) more than 1 (or in general Y) such power supplies at different columns may be used to supply the currents of various columns of the array to not result in a current aggregation at the Single Regulated Power source of $N*VDD+(M-1)*X$, wherein such Y Regulated Power Sources may not be in contiguous columns but significant number of U columns apart and done when $U*X>T\%*(N*VDD+(j-1)*X)$ for various values of U, X, T, N, VDD.

For the embodiments shown in FIG. 4 and FIG. 5, the voltage of the power supply is $N*VDD+(M-1)*X$ and such a power supply is shown connected to the terminal Vss of device at location (1,1) and terminal Vdd of device at location (N, M). In other embodiments, the voltage of the power supply may be greater than $N*VDD+(M-1)*X$ and it may be connected to the terminal Vss of device at location (1,1) and terminal Vdd of device at location (N, M) through other interposing elements which may perform one or more functions and may or may not drop voltage across them.

The voltage dropping elements 251, 252, 253 $R_j$ ($j=1:M-1$) wherein $M=4$ in FIG. 2, facilitate a potential drop X that is implemented by one or more of the following: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors. In some embodiments, unequal and non-ideal voltage division of VDD in the devices belonging to the different rows of any column will also lead to a difference in desired drop of X between the Vss (or between the Vdd) terminals of devices at locations (i,j) and (i,j+1) but that non-ideality can also be reduced by controlling clock frequency or other inputs of each device and may set a lower limit on the practical choice of X in a device array implementation. In other embodiments, desired voltage $X_j$ may be kept deliberately different from each other for different values of j, and only the sum of certain number of contiguous voltages $X_j$, as described later, may be desired to be kept constant and equal to the desired potential difference between $V\_Ter_z$ to Vss terminals or $V\_Ter_z$ to Vdd terminals.

In the embodiment shown in FIG. 2, the substantially same voltage X (251, 252, 253) is generated by (M−1) voltage dropping elements ($R_j$) that are placed successively between the Vss terminals of the each of the devices of the array at locations (1,j) and (1,j+1) where $j=1:M-1$, wherein the voltage dropping elements ($R_j$) facilitate a potential drop are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

For at least some embodiments, the connections of the $V\_Ter_z$ terminals are implemented based on the following: for at least the first plurality of the devices in the array of devices, a desired potential difference of terminal $V\_Ter_z$ to terminal Vss in the device with terminal $V\_Ter_z$ is $VDTer_z$; wherein each of (M−C(z)) voltages, $(sum(X_j:X_{j+C(z)-1})$ for $j=1:(M-C(z))$, is substantially the same as $min(VDD-VDTer_z, VDTer_z)$ for $z=1:Zmax$, where C(z) is a positive integer for $z=1:Zmax$.

In the embodiments described, the described condition on $X_j$ in array notation implements the conditions for any number of $V\_Ter_z$ terminals in the entire array of devices and are referred to as "general condition statement". For the described embodiments, sum( ) notation represents the summation of all elements inside the parenthesis and min( ) represents the minimum of all elements inside the parenthesis. In this embodiment, to clarify the array notation, "(sum $(X_j:X_{j+C(z)-1})$ for $j=1:(M-C(z))$)" comprises of a vector of (M−C(z)) different voltages for a given value of index z, $(sum(X_1:X_{C(z)}), sum(X_2:X_{C(z)+1}), \ldots sum(X_{M-C(z)}:X_{M-1}))$ and each of these elements of the vector must be the same as the desired drop $min(VDD-VDTer_z, VDTer_z)$ for any given value of index z. For this embodiment, $sum(X_1:X_{C(z)})$ for $j=1$ is the first voltage out of (M−C(z)) voltages, and for example $sum(X_{M-C(z)}:X_{M-1})$ for $j=(M-C(z))$ is the $(M-C(z))^{th}$ voltage. For an embodiment, where $Zmax=2$, $M=8$; the voltages $X_j$ are to be such that, for $z=1$, $C(1)=2$, there are (M−C(z)) or (8−2) or 6 voltages that are $(X_1+X_2)$, $(X_2+X_3)$, $(X_3+X_4)$, $(X_4+X_5)$, $(X_5+X_6)$, $(X_6+X_7)$ that are supposed to be substantially same as $min(VDD-VDTer_1, VDTer_1)$; and for $z=2$, $C(2)=3$, there are (8−3) or 5 voltages that are $(X_1+X_2+X_3)$, $(X_2+X_3+X_4)$, $(X_3+X_4+X_5)$, $(X_4+X_5+X_6)$, $(X_5+X_6+X_7)$ that are supposed to be substantially same as $min(VDD-VDTer_2, VDTer_2)$ for the array of devices.

For at least some embodiments, for at least a third majority of the first plurality of the devices in the array of devices, for i=1:N and for j=1:M and for z=1:Zmax, when (VDD−VDTer$_z$) is less than VDTer$_z$, then when (j−C(z)) is greater than or equal to 1, then VDTer$_z$ terminal of the device at location (i,j) is connected to the Vdd terminal of the device at location (i,j−C(z)) and when (j−C(z)) is less than 1, then V_Ter$_z$ terminal of the device at location (i,j) is connected to the Vss terminal of the device at location (i,j−C(z)+M), and when (VDD−VDTer$_z$) is greater than or equal to VDTer$_z$, then when (j+C(z)) is less than or equal to M, then V_Ter$_z$ terminal of the device at location (i,j) is connected to the Vss terminal of the device at location (i,j+C(z)) and when (j+C(z)) is greater than M, then V_Ter$_z$ terminal of the device at location (i,j) is connected to the Vdd terminal of the device at location (i,j+C(z)−M). In the embodiments above, the described connections in array notation implement the connections for any number of V_Ter$_z$ terminals in the entire array of devices and are referred to as "general connection statement".

For the embodiment shown in FIG. 2, M=4, C(z)=1, Zmax=1 and min(VDD−VDTer$_z$, VDTer$_z$)=VDTer$_z$=X where X is the desired voltage of V_Ter$_1$, so for this embodiment, the general condition statement "each of (M−C(z)) voltages, (sum($X_j$:$X_{j+C(z)−1}$) for j=1:(M−C(z))), are substantially the same as min(VDD−VDTer$_z$, VDTer$_z$) for z=1: Zmax", reduces to "each M−1 voltages ($X_j$ for j=1:M−1), are substantially the same as X" and the integer M is chosen to ensure that (M*X−VDD) is designed to be as close to zero voltage as possible for a balanced operation of voltages and current flows in the array of devices. In this embodiment any deviation from that may result in imbalances in the array but those could be resolved by adjusting external parameters. When the described embodiments reference voltage of V_Ter$_z$, the reference is to the difference of potential of V_Ter$_z$ terminal to potential of Vss terminal of the device containing the V_Ter$_z$ terminal, where potential of Vss terminal is considered as 0 without any loss of generality as all potentials inside any device are all referenced to Vss. In an embodiment, if not possible to ensure (M*X−VDD)=0, then (M*X−VDD) is designed to be in a voltage range of (−X/2, X/2). Brackets or parenthesis notation used here indicates that the end point voltages are included. In all mathematical formulas, "*" designates the operation of multiplication. In another embodiment, the integer M can be chosen to ensure that ((M−1)*X−VDD)=0 (or if not possible to design as close to zero as possible, in a voltage range of (−X/2, X/2)) to lead to the choice of a single power supply source for the device at location (N,M) to have a voltage of (N+1)*VDD instead of (N*VDD+(M−1)*X). However, to fully balance the array in such embodiment is harder and significant external parameter adjustment may be needed.

Reference in the described embodiment to a "third majority" means that more than 50% of the devices in the first plurality and more than 50% of the connections as described for that embodiment are made, but not all the connections may be made for other reasons. It is anticipated in an embodiment that if all the connections are made, and the third majority in the first plurality therefore means all the devices of the first plurality then that leads to a more balanced operation. It is also anticipated in at least some embodiments the first plurality may be all the devices in the array of devices. In an embodiment when $X_j$ are not all equal for j=1:M−1, to achieve the above connections, the connections need to be made the ensure that the sum of C(z) number of any contiguous $X_j$ voltages across the entire array, is the same as the minimum of the (difference between V_ter$_z$ terminal and the Vss terminal) or (the difference between Vdd Terminal and V_Ter$_z$ terminal) to allow the appropriate connections of V_Ter$_z$ terminal to Vss terminal or Vdd terminal C(z) columns away.

For the embodiment of FIG. 2, since (VDD−VDTer$_z$) is greater than or equal to VDTer$_z$, M=4, C(z)=1, Zmax=1, the following portion of the general connections statement as mentioned previously would be operative "for i=1:N and for j=1:M, when (j+C(z)) is less than or equal to M, then V_Ter$_z$ terminal of the device at location (i,j) is connected to the Vss terminal of the device at location (i,j+C(z)) and when (j+C(z)) is greater than M, then V_Ter$_z$ terminal of the device at location (i,j) is connected to the Vdd terminal of the device at location (i,j+C(z)−M)" that reduces to "for i=1:N and for j=1:4, when (j+1) is less than or equal to 4, then V_Ter$_1$ terminal of the device at location (i,j) is connected to the Vss terminal of the device at location (i,j+1) and when (j+1) is greater than M, then V_Ter$_1$ terminal of the device at location (i,j) is connected to the Vdd terminal of the device at location (i,j+1−M)" and that is what is shown in the FIG. 2, where the V_Ter$_1$ terminal of the device at location (i,j) is connected to Vss terminal of the device at location (i,j+1) for j=1:3, and for i=1:N and for j=4, V_Ter$_1$ terminal of device at location (i,4) is connected to the Vdd terminal of the device at location (i,1).

In the embodiment shown in FIG. 2, while it is apparent from the connections shown, the operation of balanced voltages and balanced currents can further be explained. In the embodiment shown in FIG. 2, V_Ter$_1$ can represent a raised ground terminal of the devices, wherein inside any device, if Vdd supplies current $I_j$ from Vdd terminal to Vss terminal and current $I_{jR}$ from the Vdd terminal to the V_Ter$_1$ terminal then for full balancing of current, the Vdd terminal of each device at location (i,j) receives one current $I_j$ from the device in a row higher and one current $I_{jR}$ from the device in the row higher and in a staggered column, except for the first column, where the $I_{jR}$ current sunk into V_Ter$_1$ of device (i,4) is fed back to the Vdd of device (i,1) for all currents to be fully balanced and all desired voltages for V_Ter$_1$ to be generated by staggered voltages across the columns. For at least some embodiments, the best balancing of current and voltages across the array of devices may be obtainable if all devices are substantially similar though in some embodiments some of the devices may be kept different for various reasons.

For the embodiment of FIG. 2, M devices (4 devices in FIG. 2) out of N*M may not be fully symmetric with all the connections and dummy device load balancing may be used in the array if better balancing is desired. It is also to be noted that in other embodiments, all the connections as indicated need not be made for some reasons, but only majority of the connections may be made.

Figure 3:
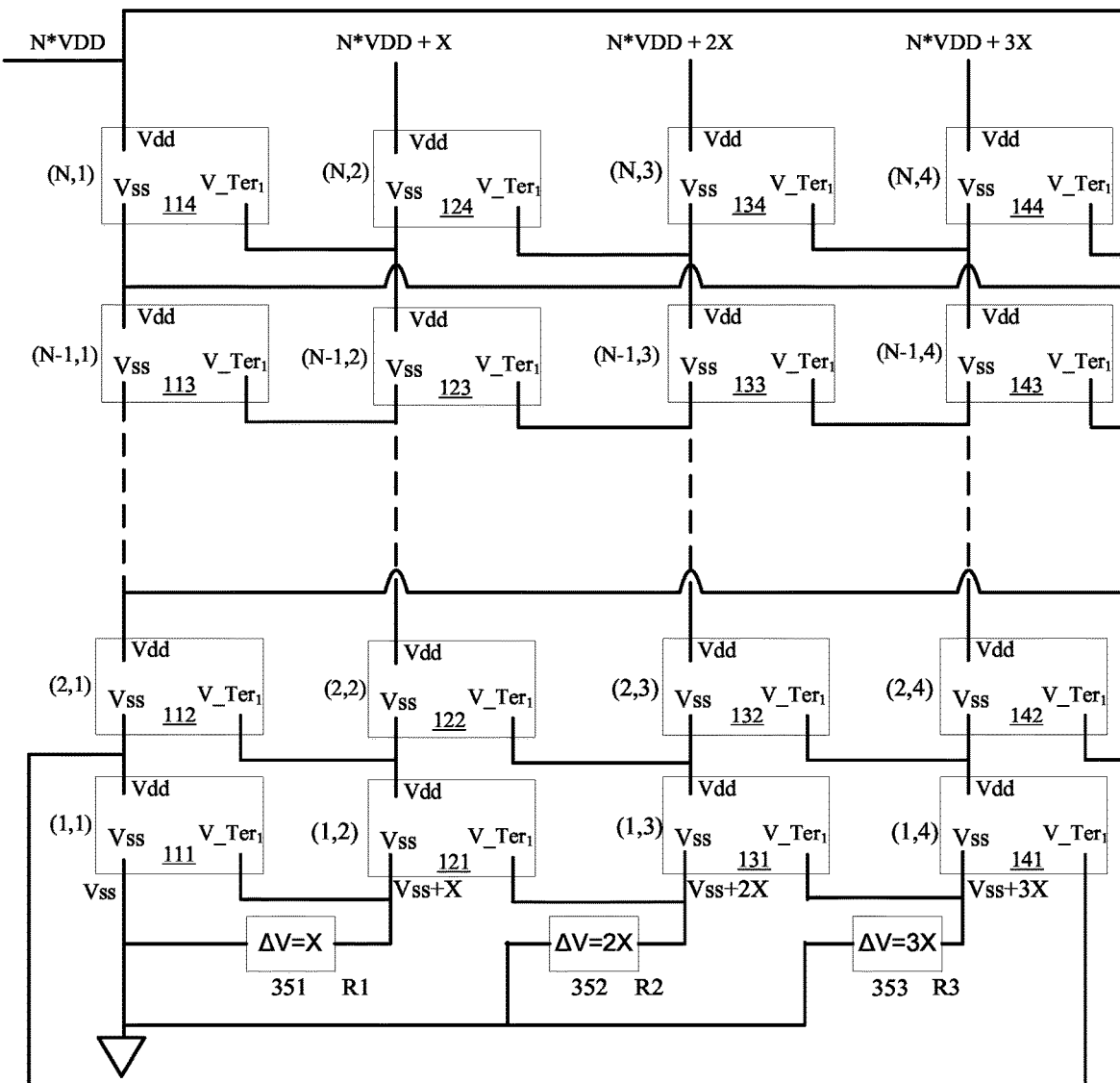

For an embodiment, as shown in FIG. 3, for j=1:M−1, the Rx1 and Rx2 terminals of the voltage dropping element $R_j$ are connected to the Vss terminals of the devices at locations (1,j+1) and (1,1) in the array of devices.

FIG. 3 shows a block diagram of an array of devices 111, 112, 113, 114, 121, 122, 123, 124, 131, 132, 133, 134, 141, 142, 143, 144 that include power supply stacking, according to an embodiment. As previously described, the dashed line convention in the column is shown in the Figure to indicate that there could be more devices in each column than the devices shown. As shown, each device within the array of devices 111, 112, 113, 114, 121, 122, 123, 124, 131, 132, 133, 134, 141, 142, 143, 144 is specified by a location (i,j) within the array of devices 111, 112, 113, 114, 121, 122, 123, 124, 131, 132, 133, 134, 141, 142, 143, 144, wherein i is a row index ranging from 1 to N, and j is a column index ranging from 1 to M. For an embodiment, each device includes a Vdd terminal to source current to the device, and a Vss terminal to sink current from the device, wherein the Vdd terminal has a higher potential than the Vss terminal. For an embodiment, at least the first plurality of the devices in the array of devices further include Zmax number of V_Ter$_z$ terminals where V_Ter$_z$ terminals can be used to source current to the device or to sink current from the device or could be a reference voltage to the device. As previously stated, many different embodiments can be used to implement the positioning of the Voltage Dropping Elements in the row 1 (or any other row). For the embodiment shown in FIG. 3, Zmax=1, M=4, C(1)=1, X$_j$ are all substantially same as X that is equal to VDTer$_z$ and (VDD−VDTer$_z$) is greater than or equal to VDTer$_z$.

For the embodiment shown in FIG. 3, the devices 351, 352, 353 are voltage dropping elements that implement the voltage drop X between Vss terminals of all columns j and column 1 (as opposed to being between columns j−1 and j in embodiment shown in FIG. 2) where j=2:M. In this embodiment, only the currents conducted through each individual column j+1:M of the plurality of devices is conducted through R$_j$ for j=1:M−1, and therefore, for the same voltage drop X across the columns j and j+1, the voltage drop across these Rj devices is j*X, and the value of the voltage dropping element Rj=j*X/(I$_{j+1}$) for j=1:M−1 where I$_j$ represents the current through the column j. As previously described, in this case, ideally the same voltage difference of X between the Vss Terminals (and also between the Vdd Terminals) of devices (i,j) and (i,j+1) is created for i=1:N and j=1:M−1, if an equal voltage division of VDD were to happen throughout the devices in any given column j. The voltage dropping elements 351, 352, 353 Rj (j=1:M−1, M=4) where in FIG. 3, M=4, facilitating a potential drop X are implemented by one or more of the following: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

For the embodiment of FIG. 3, the substantially same voltage X is generated by (M−1) voltage dropping elements (R$_j$) that are placed between Vss terminals of the devices at locations (1,1) and (1,j+1) where j=1:M−1, and current through each column (j+1) is conducted through R$_j$, wherein the voltage dropping elements (R$_j$) facilitating a potential drop are implemented by one or more of the: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

For the embodiment of FIG. 3, the connections of voltage dropping elements is different from FIG. 2, but the general condition statement reduces to the same as FIG. 2 where "(M−1) voltages, (X$_j$ for j=1:(M−1)), are substantially the same as X" and all the connections to generate V_Ter$_z$ are the same as described for FIG. 2, where the V_Ter$_1$ terminal of the device at location (i,j) is connected to Vss terminal of the device at location (i,j+1) for j=1:3, and for i=1:N and for j=4, V_Ter$_1$ terminal of device at location (i,4) is connected to the Vdd terminal of the device at location (i,1).

For an embodiment, for j=1:M−1, the Rx2 terminal of voltage dropping element R$_j$ is connected to the Vdd terminal of the device at location (N,j) in the array of devices, and the Rx1 terminal of R$_j$ is connected to the Vdd terminal of one of the (M−j) devices at (M−j) locations in row N from (N,j+1) to (N,M) in the array of devices.

The described embodiments show that there are very large number of ways, possibly factorial (M−1)=((M−1)*(M−2)* . . . 2*1) ways, to connect the R$_j$ voltage dropping elements across row N to allow a Direct Current (DC) path from each of the Vdd terminals of devices at locations (N,j) to Vdd terminal of the device at location (N,M), and this is because the device at any location j in row N has (M−j) different higher potential nodes to connect to, to find a DC path to Vdd at location (N,M). It is to be noted that in various embodiments, the Vdd terminal of device at location (N,M) is connected to a higher potential terminal of a power supply with voltage N*VDD+(M−1)*X.

For an embodiment, the Vss terminal of the device at location (1,1) is connected to a lower potential of two terminals of a power supply and the Vdd terminal of the device at location (N,M) is connected to a higher potential of the two terminals of the power supply; wherein for j=1:M−1 the Rx1 and Rx2 terminals of the voltage dropping element (R$_j$) are connected to the Vdd terminals of the devices at locations (N,j+1) and (N,j).

FIG. 4 shows a block diagram of an array of devices 111, 112, 113, 114, 121, 122, 123, 124, 131, 132, 133, 134, 141, 142, 143, 144 that include power supply stacking, according to an embodiment. As previously described, the dashed line convention in the column is shown in the Figure to indicate that there could be more devices in each column than the devices shown. As shown, each device within the array of devices 111, 112, 113, 114, 121, 122, 123, 124, 131, 132, 133, 134, 141, 142, 143, 144 is specified by a location (i,j) within the array of devices 111, 112, 113, 114, 121, 122, 123, 124, 131, 132, 133, 134, 141, 142, 143, 144, wherein i is a row index ranging from 1 to N, and j is a column index ranging from 1 to M. For an embodiment, each device including a Vdd terminal to source current to the device, and a Vss terminal to sink current from the device, wherein the Vdd terminal has a higher potential than the Vss terminal. For an embodiment, at least the first plurality of the devices in the array of devices further include Zmax V_Ter$_z$ terminal where V_Ter$_z$ terminal can be used to source current to the device or to sink current from the device or could be a reference voltage to the device. For FIG. 4, Zmax=1, M=4, C(1)=1, X$_j$ are all substantially same as X that is equal to VDTer$_z$, and (VDD−VDTer$_z$) is greater than or equal to VDTer$_z$.

As previously stated in regard to FIG. 2, at least 3 different embodiments can be utilized to generate the N*VDD+(j−1)*X voltage of row N, and for the embodiment of FIG. 4, generating the N*VDD+(j−1)*X voltages is shown where voltage dropping elements Rj are implemented between the Vdd terminals of devices (N,j) and (N,j+1) where j=1:M−1, and generating the N*VDD+(j−1)*X voltages in this embodiment is from a single power supply N*VDD+(M−1)*X or N*VDD+3X as M=4, C(z)=1, all X$_j$ for j=1:(M−1) are the substantially same voltage X, in this embodiment shown in FIG. 4. In this embodiment shown in FIG. 4, a sum of all currents conducted through each column 1:j of the plurality of devices is conducted through R$_j$ and therefore for the same voltage drop X across the individual voltage dropping elements, the value of the voltage dropping element R$_j$=X/(sum(I$_1$:I$_j$)) for j=1:M−1 where I$_j$ represents the current through the column j.

As in previously described embodiments, ideally the same voltage difference of X between the Vss Terminals (and also between the Vdd Terminals) of devices (i,j) and (i,j+1) is created for i=1:N and j=1:M−1, if an equal voltage division of VDD is realized across the devices in any given column j. The voltage dropping elements 451, 452, 453 Rj (j=1:M−1, M=4) wherein, M=4, facilitating a potential drop X are implemented by one or more of the following: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors. In this embodiment, implementation of the drop in the Vss terminals of row 1 is not shown but can be implemented utilizing one of several possible embodiments including but not limited to the embodiments shown in FIGS. 2 and 3 before, by including another series of voltage dropping elements R$2_j$ in row 1 between Vss terminals of devices at locations (1,j) and (1,j+1) for j=1:M−1 or between Vss terminals of devices (1,j+1) and (1,1) for j=1:M−1.

For at least some embodiments, FIG. 4 includes the Vss terminal of the device at location (1,1) being connected to a lower potential of two terminals of a power supply, wherein the power supply has a potential difference of substantially same as N*VDD+(M−1)*X or higher; and the Vdd terminal of the device at location (N,M) is connected to a higher potential of the two terminals of the power supply, wherein the substantially same voltage X is generated by (M−1) voltage dropping elements ($R_j$) that are placed successively between the Vdd terminals of each of the devices at locations (N,j) and (N,j+1) where j=1:M−1, wherein the voltage dropping elements ($R_j$) facilitating a potential drop are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

It is to be understood that in at least some embodiments, in the portion of the general condition statement "wherein each of (M−C(z)) voltages, (sum($X_j$:$X_{j+C(z)-1}$) for j=1:(M−C(z))), is substantially the same as min(VDD−VDTer$_z$, VDTer$_z$)", wherein reference in the described embodiments is made to the array of voltages or any other voltages to be "substantially the same" or "substantially same", that "substantially the same" or "substantially same" means that the nominal design of the voltage dropping elements and the devices or the currents through the devices or voltage dropping elements is done such that the nominal values of these (M−C(z)) different voltages across the array, or any other voltages being termed as "substantially the same" or "substantially same" as some other voltage, are designed or desired to be equal. However it is understood that when referring them as "substantially the same" or "substantially same", any manufacturing tolerances and/or temperature variations and/or non-ideal I*R (current multiplied by undesired resistance or variation of currents from designed ideal value) drops in the array or other undesirable non-idealities can make such desired or designed equality of voltages different than each other and that is why they are referred to as "substantially the same" or "substantially same" and not "exactly the same".

It is also to be understood that for at least some embodiments, when referred to as "substantially the same as N*VDD+(M−1)*X" that means the power supply source voltage is to be "designed" to have a "nominal" value of N*VDD+(M−1)*X for optimal drops across the entire array, however practical manufacturing tolerances and practical variations in power supply source that is designed to have such nominal values of N*VDD+(M−1)*X can often cause the power supply voltage to be lower and sometimes higher than that designed nominal voltage just due to variations or other reasons. It is further to be noted that in at least some embodiments, the connection between the Vss terminal of the device at location (1,1) to the lower potential of two terminals of the power supply may not be shorted and may be through 1 or more different voltage dropping elements or even other interposing elements including inductors, resistors or capacitors that are used for power supply filtering circuits or other purposes and the connection between the Vdd terminal of the device at location (N, M) to the higher potential of two terminals of the power supply may also not be shorted but maybe through 1 or more voltage dropping elements or even other interposing elements including inductors, resistors or capacitors that are used for power supply filtering or other purposes. When it is described that potential difference of the power supply is to be kept substantially same as N*VDD+(M−1)*X or "higher", the reference to word "higher" being if any voltage dropping or other interposing elements are introduced between the lower terminal of the power supply and the terminal (1,1) in some embodiments, or between the terminal of the power supply and the terminal (N, M) in other embodiments, then even the nominal value of power supply needs to be higher than N*VDD+(M−1)*X.

For the described embodiments, when the connections are described in the entire array of devices by use of words "is connected to" "being connected to" or "connections" whether between Vss terminals to Vdd terminals of different devices or between V_Ter terminals or V_Ter_2 terminals or other terminals of any of the devices to other terminals like Vdd terminals or Vss terminals of any of the other devices, they may not necessarily be "shorted" connections (where a shorted connection between 2 terminals are be defined as a connection via an electrical wire whether realized on an IC or PCB, with intended zero, but practicably negligible resistance, and most of the connections shown in FIGS. 1-6 qualify as "shorted" connections). Such described connections wherever referenced by "connected to" "is connected to" "being connected to" or "connections", whether individually between two terminals of any two devices or same device, whether in array notation or not, can be through interposing filtering circuits or other interposing elements between any 2 connected terminals described in the connection, wherein such interposing elements or filtering circuits in between, do not affect the desired functionality of achieving the same or similar voltage of the two terminals that such a described connection between the two terminals intends to achieve.

For the embodiment of FIG. 4, the connections of voltage dropping elements is different from FIG. 2-3, but the general condition statement reduces to the same as FIG. 2 where "M−1 voltages that are equal to Xj for j=1:M−1, are substantially the same as X" and all the connections to generate V_Ter$_z$ are the same as described for FIG. 2, where the V_Ter$_1$ terminal of the device at location (i,j) is connected to Vss terminal of the device at location (i,j+1) for j=1:3, and for i=1:N and for j=4, V_Ter$_1$ terminal of device at location (i,4) is connected to the Vdd terminal of the device at location (i,1).

For an embodiment, the Vss terminal of the device at location (1,1) is connected to a lower potential of two terminals of a power supply and the Vdd terminal of the device at location (N,M) is connected to a higher potential of the two terminals of the power supply; wherein for j=1:M−1 the Rx1 and Rx2 terminals of the voltage dropping element ($R_j$) are connected to the Vdd terminals of the devices at locations (N,j) and (N,M).

FIG. 5 shows a block diagram of an array of devices 111, 112, 113, 114, 121, 122, 123, 124, 131, 132, 133, 134, 141, 142, 143, 144, that include power supply stacking, according to an embodiment. As previously described, the dashed line convention in the column is shown in the Figure to indicate that there could be more devices in each column than the devices shown. As shown, each device within the array of devices 111, 112, 113, 114, 121, 122, 123, 124, 131, 132, 133, 134, 141, 142, 143, 144 is specified by a location (i,j) within the array of devices 111, 112, 113, 114, 121, 122, 123, 124, 131, 132, 133, 134, 141, 142, 143, 144, wherein i is a row index ranging from 1 to N, and j is a column index ranging from 1 to M. For an embodiment, each device including a Vdd terminal to source current to the device, and a Vss terminal to sink current from the device, wherein the Vdd terminal has a higher potential than the Vss terminal. For an embodiment, at least the first plurality of the devices in the array of devices further including Zmax V_Ter$_z$ terminal where V_Ter$_z$ terminal can be used to source current to the device or to sink current from the device or could be a reference voltage to the device. As previously stated, many different embodiments can be used to generate the N*VDD+(j−1)*X voltage of row N. For FIG. 5, Zmax=1, M=4, C(1)=1, $X_j$ are all substantially same as X that is equal to VDTer$_z$, and (VDD−VDTer$_z$) is greater than or equal to VDTer$_z$.

FIG. 5 shows an embodiment in which generating the N*VDD+(j−1)*X voltages is shown implemented with voltage dropping elements Rj between the Vdd terminals of devices (N,j) and (N,M) where j=1:M−1. For this embodiment, the N*VDD+(j−1)*X voltages are generated from a single power supply N*VDD+(M−1)*X or N*VDD+3X, with M=4, all $X_j$ for j=1:(M−1) are the substantially same voltage X. For an embodiment, only the currents conducted through each individual column j of the plurality of devices is conducted through $R_j$ for j=1:M−1 and therefore, for the same voltage drop X across the columns j and j+1, the voltage drop across these Rj devices is (M−j)*X, and the value of the voltage dropping element Rj=(M−j)*X/($I_j$) for j=1:M−1 where $I_j$ represents the current through the column j. As in previously described embodiments, ideally the same voltage difference of X between the Vss Terminals (and also between the Vdd Terminals) of devices (i,j) and (i,j+1) is created for i=1:N and j=1:M−1 if an equal voltage division of VDD is established throughout the devices in any given column j.

For an embodiment, Voltage dropping elements 551, 552, 553 $R_j$ (j=1:M−1, M=4) of FIG. 5, M=4, that facilitate a potential drop X between each columns are implemented by one or more of the following: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors. For this embodiment, implementation of the drop in the Vss terminals of row 1 is not shown, but can be implemented using several possible embodiments, including but not limited to the embodiments shown in FIGS. 2 and 3, including another series of voltage dropping elements R2$_j$ in row 1 between Vss terminals of devices at locations (1,j) and (1,j+1) for j=1:M−1 or between Vss terminals of devices (1,j+1) and (1,1) for j=1:M−1.

For the embodiment shown in FIG. 5, the Vss terminal of the device at location (1,1) is connected to a lower potential of two terminals of a power supply, wherein the power supply has a potential difference of N*VDD+(M−1)*X or higher; and the Vdd terminal of the device at location (N,M) is connected to a higher potential of the two terminals of the power supply, where the substantially same voltage X is generated by (M−1) voltage dropping elements ($R_j$) that are placed between Vdd terminals of the devices at locations (N,j) and (N,M) where j=1:M−1, wherein the voltage dropping elements ($R_j$) facilitating a potential drop are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

For the embodiment shown in FIG. 5, the connections of voltage dropping elements is different from FIG. 4, but the general condition statement reduces to the same as FIG. 2 where "M−1 voltages that are equal to $X_j$ for j=1:M−1, are substantially the same as X" and all the connections to generate V_Ter$_z$ are the same as described for FIG. 2, where the V_Ter$_1$ terminal of the device at location (i,j) is connected to Vss terminal of the device at location (i,j+1) for j=1:3, and for i=1:N and for j=4, V_Ter$_1$ terminal of device at location (i,4) is connected to the Vdd terminal of the device at location (i,1).

As disclosed in the embodiments shown in FIGS. 2-5, potential of one V_Ter$_1$ terminal is to be generated in addition to the potentials of the Vdd terminal and Vss terminal, and the voltages $X_j$ for j=1:(M−1) are the substantially same voltage X which is the same as VDTer$_1$.

For other embodiments, not shown in FIGS. 2-5 based on value of VDter$_1$, when (still) M=4, C(z)=1, M−1 voltages that are equal to $X_j$ for j=1:M−1, are substantially the same as X, but when (VDD−VDTer$_z$) is less than VDTer$_z$, the following portion of the general connection statement becomes operative, "for at least a third majority of devices in the first plurality of devices in the array of devices, for i=1:N, j=1:M, when (j−C(z)) is greater than or equal to 1, then V_Ter$_z$ terminal of the device at location (i,j) is connected to the Vdd terminal of the device at location (i,j−C(z)) and when (j−$C_z$) is less than 1, then V_Ter$_z$ terminal of the device at location (i,j) is connected to the Vss terminal of the device at location (i,j−C(z)+M)". Therefore for the above embodiments, the above connections are described as following: for a third majority of devices in the first plurality of devices in the array of devices, for i=1:N and for j=2:4, VDTer$_1$ terminal of the device at location (i,j) is connected to the Vdd terminal of the device at location (i,j−1) and for i=1:N and for j=1, the V_Ter terminal of the device at location (i,1) is connected to the Vss terminal of the device at location (i, 4).

These connections above are not shown in any FIG. 2-5 but can be simply rewired in the same figures where the connections from VDTer$_1$ terminals would have been to neighboring devices Vdd terminals per the above array notation.

For an embodiment, M=6, Zmax=1, C(1)=2 is considered wherein the first plurality of devices includes only 50% of devices in the array of devices in columns 1, 3 and 5 and all the devices in columns 2, 4 and 6 are considered to have no extra V_Ter$_z$ terminal, (VDD−VDTer$_z$) is greater than or equal to VDTer$_z$, and the third majority in the first plurality is all the devices of that plurality. For this embodiment, reference to "each of a (M−C(z)) voltages that are equal to sum($X_j$:$X_{j+C(z)−1}$) for j=1:(M−C(z)), are substantially the same as min(VDD−VDTer$_z$, VDTer$_z$)" means 4 voltages ($X_1$+$X_2$), ($X_2$+$X_3$), ($X_3$+$X_4$), ($X_4$+$X_5$) are the same as VDTer$_1$, and therefore, VDD/(M/(C(1)) or VDD/3. In this embodiment, connections are described based on the following portion of the general connection statement that becomes operative "for at least a third majority of the first plurality of the devices in the array of devices, for i=1:N and for j=1:M, when (j+C(z)) is less than or equal to M, then V_Ter$_z$ terminal of the device at location (i,j) is connected to the Vss terminal of the device at location (i,j+C(z)) and when (j+C(z)) is greater than M, then V_Ter$_z$ terminal of the device at location (i,j) is connected to the Vdd terminal of the device at location (i,j+C(z)−M)" means that for i=1:N and for j=1 and 3, the V_Ter$_1$ terminal of the device at location (i,j) is connected to the Vss terminal of the device at location (i,j+2) and for i=1:N; and for j=5, V_Ter$_1$ terminal of device at location (i,5) is connected to the Vdd terminal of the device at location (i,1). In this embodiment, ($X_1$,$X_2$,$X_3$,$X_4$,$X_5$) can be kept as (VDD/6, VDD/6, VDD/6, VDD/6, VDD/6) mV or (VDD/6−B, VDD/6+B, VDD/6−B, VDD/6+B, VDD/6−B) or (VDD/6+B, VDD/6−B, VDD/6+B, VDD/6−B, VDD/6+B), where B is a voltage less than VDD/6. This embodiment may be less balanced than the embodiment where the first plurality comprised of all of the devices in the array, but a reasonably balanced voltage generation of V_Ter$_1$ is still possible and goes on to show that an embodiment where the first plurality is neither a majority nor all of devices in the array of devices.

For an embodiment, it is to be noted that N may be equal to 1, and then only one device may exist in a column and the Vdd terminal to Vss terminal connections are not stacked in a column and the potentials of Vdd terminals of each of the devices of the first plurality of devices are not generated by array terminals but through the (M−1) $R_j$ voltage dropping elements with a single power supply source or through M different power supply sources for each of the M devices left in that embodiment. In such an embodiment the V_Ter$_z$ voltages can still be generated by the array of devices that reduce to just a row vector, from all the devices in row 1.

The array of voltages generated as illustrated can be configured in many different connections to realize V_Ter$_z$ in different mechanisms, which in some cases can be even less balanced than the illustration above or achieved the same balancing by other mechanisms.

FIG. 6 shows a block diagram of an array of devices 111, 112, 113, 114, 121, 122, 123, 124, 131, 132, 133, 134, 141, 142, 143, 144, that include power supply stacking and staggered voltage distribution, according to another embodiment. FIG. 6 shows an embodiment that includes at least 2 additional terminals V_Ter$_1$ and V_Ter$_2$. FIG. 6 further shows voltage dropping elements 651, 652, 653, 654, 655. This embodiment is in contrast to the embodiments of FIGS. 2-5 wherein only at least one extra terminal voltage V_Ter is generated from the array of devices. Specific connections for connecting the 2 terminal voltages V_Ter and V_Ter_2 is difficult to show figuratively but are described herein.

For an embodiment, the potential of VDTer$_1$ terminal is closer to potential of Vss terminal compared to the potential of the Vdd Terminal and the potential of V_Ter$_2$ terminal is closer to potential of Vdd Terminal compared to the potential of the Vss Terminal. For an embodiment, the potentials of the VDTer$_1$ and V_Ter$_2$ terminals are both closer to the potential of Vss Terminal compared to the potential of Vdd Terminal. For an embodiment, the potentials of the VDTer$_1$ and V_Ter$_2$ terminals are both closer to potential of Vdd Terminal compared to the potential of Vss terminal.

For an embodiment, wherein the potential of VDTer$_1$ terminal is closer to potential of Vss terminal compared to the potential of the Vdd Terminal and the potential of V_Ter$_2$ terminal is closer to potential of Vdd Terminal compared to the potential of the Vss terminal, consider Zmax=2, and consider VDD−VDter$_2$=2*VDter$_1$, then for this embodiment, the general condition statement, "each of (M−C(z)) voltages, (sum($X_j$:$X_{j+C(z)−1}$) for j=1:(M−C(z))), is substantially the same as min(VDD−VDTer$_z$, VDTer$_z$) for z=1: Zmax", for z=1, reduces to "each of (M−C(1)) voltages, (sum($X_j$:$X_{j+C(1)−1}$) for j=1:(M−C(1))), are substantially the same as VDTer$_1$; and for z=2, reduces to "each of (M−C(2)) voltages, (sum($X_j$:$X_{j+C(2)−1}$) for j=1:(M−C(2))), are substantially the same as 2*VDTer$_1$". In this embodiment, since each of the M−(C(2)) voltages over any running C(2) number of columns are twice the value of each of M−(C(1)) voltages over any running C(1) number of columns, then if the difference in array voltages columns has been implemented with a finer granularity or half the VDTer$_1$, then C(1) is chosen to be 2, C(2) is chosen to be 4, then the 2 conditions reduce to "each of (M−2) voltages, (sum($X_j$, $X_{j+1}$), for j=1:(M−2)), are substantially the same as VDTer$_1$" and ""each of (M−4) voltages, (sum($X_j$:$X_{j+3}$) for j=1:(M−4)), are substantially the same as 2*VDTer$_1$". By the first condition, it cannot be assumed all Xj to be the same for this embodiment but any running sum of 2 Columns differences in voltages (since C(1)=2) is the same, so any two (Xj,Xj+1) must be (VDTer$_1$/2−B, VDTer$_1$/2+B) for j=1:M−2.

For an embodiment, assuming all the devices in the array of devices are the devices of the first plurality the following connections are made per the operative portion of the general connection statement: for i=1:N and for j=1:M, when (j+2) is less than or equal to M, then VDTer$_1$ terminal of the device at location (i,j) is connected to the Vss terminal of the device at location (i,j+2) and when (j+2) is greater than M, then VDTer$_1$ terminal of the device at location (i,j) is connected to the Vdd terminal of the device at location (i,j+2−M); and for i=1:N and for j=1:M, when (j−4) is greater than or equal to 1, then V_Ter$_2$ terminal of the device at location (i,j) is connected to the Vdd terminal of the device at location (i,j−4) and when (j−4) is less than 1, then V_Ter$_2$ terminal of the device at location (i,j) is connected to the Vss terminal of the device at location (i,j−4+M).

At least some of the described embodiments make reference to the "desired voltage" of the V_Ter$_z$ and that voltage of V_Ter$_z$ terminal is the potential difference of potential of V_Ter$_z$ terminal from Vss terminal. It is understood that prior to connection of the V_Ter$_z$ terminals to the terminals of the neighboring devices Vdd or Vss terminals, the potential of the V_Ter$_z$ terminals is not yet defined and the selection process of whether to connect it to Vdd or Vss terminals of the neighboring devices is based on therefore the "expected" or "desired" or "designed" value of the potential of the V_Ter$_z$ terminals which is set during the design of the device based on certain goals including the amount of power saving and/or timing and delay constraints and in case of analog circuits based on the desired reference voltage needed. In several embodiments reference is made to the potential or voltage of the V_Ter$_z$ terminals without using the word "desired" ahead of the potential or voltage of these terminals and in such cases the reference to the V_Ter$_z$ terminal potentials is the desired designed potential that results after the desired designed connections are already made.

At least some embodiments include 3 or more $V\_Ter_z$ terminals even though not shown in the Figures. The number of combinations for such voltages being closer to Vdd or Vss or the difference between those voltages to Vss or Vdd is large. However, the general condition statement and general connection statement both apply to determine the array desired $X_j$ voltages and the connections of the $V\_Ter_z$ to the array terminals.

For an embodiment, each device has a difference in potential between Vdd terminal and Vss terminal of a desired potential of VDD. Observation of FIG. 1 suggests that equal voltage division is achieved for each of the devices by the connections described previously between Vdd and Vss terminals in any column j for a balanced operation where in 1 embodiment all the connections described are made. However, for the described embodiments, in practice VDD may be slightly different for each device than the desired VDD at least due to manufacturing deviations of each device or at least due to different input vectors. For at least some embodiments, such differences of the potential difference between Vdd–Vss to the desired VDD can be attempted to be adjusted (compensated) by adjusting input vectors and/or input clock frequency as among a few exemplary parameters. For an embodiment, this is accomplished because changing input vectors or input clock frequency changes the impedance of the device, and therefore, if any non-idealities, such as, manufacturing deviations or other sources of non-idealities responsible for difference in impedances of the devices to begin with causing such different than VDD drops across them, then such adjustment of impedances of the device through input vectors or clock frequency can compensate for the non-idealities.

For an embodiment, wherein one of more of the devices are controllable by one or more external parameters or inputs, wherein changing the external parameters or inputs changes an impedance of the devices and the potential difference between the Vdd terminal and the Vss terminal of the one or more devices. For an embodiment, the external parameters or inputs comprise at least a clock frequency of operation of the one or more devices.

While the FIGS. 1-6 show 2 dimensions, the arrays of devices are not restricted to 2 dimensions and may be extended to a $3^{rd}$ dimension. The array of devices as described with only row index i and column index j may be considered a special case of a 3-dimensional array for a constant third dimensional index k, and the $3^{rd}$ dimension with index k therefore not being considered in such 2-dimensional array notation. At least some embodiments include the $3^{rd}$ dimension for which the similar staggered distribution of $X_j$ voltages in the 2nd column with index j is devised in the $3^{rd}$ dimension with index k as a staggered distribution of $W_k$ voltages. For an embodiment, each of the $W_k$ voltages are such that the sum of all $W_k$ voltages for k=1:(L−1) is at least greater than or substantially same as VDD/2 and lesser than VDD. It is to be understood that 3-dimensional arrays may be harder to realize in practice but may lead to even larger selections of new potentials of the terminal potentials to be generated.

For some embodiments, the array of devices includes a second staggered voltage distribution by voltage $W_k$ in a $3^{rd}$ dimension specified by an index k; wherein any location in the array specified as (i, j, k), with row index i ranging all integers from 1 to N, and $1^{st}$ column index j ranging all integers from 1 to M, and 2nd column index ranging all integers from 1 to L, where L is a positive integer greater than or equal to 2, wherein when N is greater than 2, then for at least the first majority of the devices in the array of devices, the Vss terminal of device at location (i,j,k), for i=2:N, is connected to the Vdd terminal of the device at location (i−1,j,k), thereby providing a substantially same voltage VDD between the terminals Vdd and Vss of at least the first majority of the devices in the array; and wherein for at least the fourth majority of the devices in the array of devices, the potential of Vss terminal for device at any location (i,j+1,k) is generated to be higher than the potential for the Vss terminal for a device at location (i,j,k) by a voltage $X_j$, for i=1:N, j=1:(M−1),k=1:L; and wherein for at least a fifth majority of the devices in the array of devices, the potential of the Vss terminal for a device at any location (i,j,k+1) is generated to be higher than the potential for the Vss terminal a device at location (i,j,k) by a voltage $W_k$, for i=1:N, j=1:M,k=1:(L−1).

For an embodiment, one or more of the devices are controllable by one or more external parameters or inputs, wherein changing the external parameters or inputs changes an impedance of the devices and the potential difference between the Vdd terminal and the Vss terminal of the one or more devices. For an embodiment, the external parameters or inputs include at least a clock frequency of operation of the one or more devices.

For an embodiment, the voltage dropping elements are placed both in row 1 and row N of the array of devices. Further, for an embodiment, there are 2 sets of voltage dropping elements $R_j$ and $R2_j$ where j=1:M−1, where $R_j$ position is the same as was shown in FIGS. 4 and $R2_j$ positioning in the array is the same as was shown in FIG. 2, for the example case of M=4.

For an embodiment, for j=1:M−1, the Rx1 and Rx2 terminals of the additional voltage dropping element $R2_j$ are connected to the Vss terminals of the devices at locations (1,j+1) and (1,j) in the array of devices, wherein the voltage dropping elements $R2_j$ are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

For an embodiment, the voltage dropping elements are placed both in row 1 and row N of the array of devices. Further, for an embodiment, there are 2 sets of voltage dropping elements $R_j$ and $R2_j$ where j=1:M−1, where the voltage dropping element $R_j$ position is the same as was shown in FIG. 4 and voltage dropping element $R2_j$ positioning in the array is the same as shown in FIG. 3, for the example case of M=4.

For an embodiment, for j=1:M−1, the Rx1 and Rx2 terminals of the additional voltage dropping element $R2_j$ are connected to the Vss terminals of the devices at locations (1,j+1) and (1,1) in the array of devices, where such voltage dropping elements $R2_j$ are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

For an embodiment, the voltage dropping elements are placed both in row 1 and row N in the array of devices. Further, for an embodiment, there are 2 sets of voltage dropping elements $R_j$ and $R2_j$ where j=1:M−1, where the voltage dropping element $R_j$ position is the same as was shown in FIG. 5 and the voltage dropping element $R2_j$ positioning in the array is the same as was shown in FIG. 2, for the example case of M=4.

For an embodiment, for j=1:M−1, the Rx1 and Rx2 terminals of the additional voltage dropping element $R2_j$ are connected to the Vss terminals of the devices at locations (1,j+1) and (1,j) in the array of devices, where the voltage dropping elements $R2_j$ are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

For an embodiment, the voltage dropping elements are placed both in row 1 and row N in the mechanism and there are 2 sets of voltage dropping elements $R_j$ and $R2_j$ where j=1:M−1, where the voltage dropping element $R_j$ positioning is the same as was shown in FIG. 5 and voltage drop element $R2_j$ positioning in the array is the same as was shown in FIG. 3, for the example case of M=4.

For an embodiment, for j=1:M−1, the Rx1 and Rx2 terminals of the additional voltage dropping element $R2_j$ are connected to the Vss terminals of the devices at locations (1,j+1) and (1,1) in the array of devices, where the voltage dropping elements $R2_j$ are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

Similar as described for the devices in the array, the voltage dropping elements can also have more than 2 terminals and be controllable by external parameters or additional inputs at those additional terminals to those voltage dropping elements other than the 2 terminals in the array shown. For an embodiment, the external parameters or inputs can control the potential drop between the 2 terminals of the voltage dropping elements in the array, by changing either the impedance or other characteristics of those voltage dropping elements. For an embodiment, changes of the voltage dropping elements can be used to make sure the substantially same voltage drop desired across those voltage dropping elements (X or jX or (M−j)*X), for different values of j, is achieved to a better degree of accuracy, even in presence of either the currents through the voltage dropping elements being different from desired or the desired values of the voltage dropping elements being different from desired, in either case due to practical manufacturing tolerances or temperature or voltage variations. For at least some embodiments, the external parameters or the inputs to the devices in the array of devices can be a clock frequency if such voltage dropping elements are implemented as a switched capacitor resistor. For at least some embodiments, if the implementation of the voltage dropping elements includes resistors, the resistors can be selected to be different than what an ideal design or calculated value would be to account for the non-ideal drop in voltages due to difference in current in the columns due to manufacturing tolerances in the devices and temperature variations. For an embodiment, if the resistors are programmable by external inputs, then the inputs can be changed so that the value of the resistors is adjusted until the voltage drop across the resistors is as close to provide the desired drop across the resistors.

For an embodiment, the one or more of the voltage dropping elements (Rj) are controllable by one or more external parameters or inputs to the voltage dropping elements, wherein changing the external parameters or inputs changes the potential difference across the terminals of the voltage dropping elements that are connected in the array of devices.

For an embodiment, the one or more of the voltage dropping elements ($R_j$) and additional voltage dropping elements ($R2_j$) are controllable by one or more external parameters or inputs to the voltage dropping elements, wherein changing the external parameters or inputs changes the potential difference across the terminals of the Voltage Drop Elements that are connected in the array of devices.

Use Cases of the Described Embodiments

Finally, for at least some embodiments, various uses of the embodiments are envisioned. (a) At least some of the embodiments enable the generation of 1 or more extra terminal voltages $V\_Ter_z$ that can be done for the purpose of power consumption reduction in any device by having such extra terminal voltages representing either a lowered supply or raised Vss voltages. For at least some embodiments, the additionally introduced terminal voltages with a lowered supply or raised Vss voltages is used for power supply source or sink for lesser critical timing path circuits or circuits that have lesser accuracy or headroom requirements or wherever usable without compromising functionality and thereby optimized for lower power consumption. In some embodiments, such power reduction is effective in cases where the accuracy or timing requirement of a significant portion of the digital circuitry was not too stringent where such intermediate power source or sink terminals can be used to reduce power consumption of circuits in the devices at the expense of added delays that are tolerable for less critical timing paths. In some embodiments, power reduction is also be very effective when repetitive structure of devices were to be used for higher throughput applications, wherein large number of devices is be implemented in either a monolithic implementation or on PCB hardware implementation, wherein usage of a large number of similar devices for parallel processing or increased throughput makes the balancing, availability and generation of such additional terminals, to save power, in an effective way to each devices without wasting any power on extra devices or components needed to generate such terminal voltages. In some embodiments, such power reduction can be even more effective when devices are more tolerant to occasional errors in the computation operations of such digital logic, wherein such occasional errors may be induced due to the fact that such power sources or sinks may not be as low impedance or as accurate compared to a regulated power supply source (b) In some embodiments, such generation of 1 or more extra terminal voltages can be used for the purpose of providing a reference voltage for even analog circuit operation where such references voltages were necessary. (c) Also, the embodiments described here are not only a low cost and efficient way of generating VDD voltages from a power supply source with a voltage substantially close to (N+1)*VDD, without need for additional VDD Regulated voltage power supplies that would be needed otherwise for each device in each column that would consume costly and often infeasible/inefficient power regulation sources, but also for generating such closely spaced voltages of $V\_Ter_z$ that are even smaller than VDD without the need for additional Regulated Voltage Power supplies that would be otherwise needed for each device in each column for such $V\_Ter_z$ terminal voltages. In some embodiments, it is hard to generate through Regulated Voltage power supplies, small power supply voltages VDD, where VDD is as an example 1V or lesser that has to supply especially large currents and any terminal voltages V_Ter$_z$ that are even lower than VDD (where V_Ter$_z$ voltage can be for example as small as (25 mV-100 mV) above Vss or (25-100 mv) below Vdd), and even if such Regulated Voltage Power supplies were to be practicable to implement or get, the magnitude of the current needed to source from such Regulated Voltage Power supplies to supply such V_Ter$_z$ voltages may be high so that I*R (current multiplied by resistance) drops across the PCB traces or device routing may be prohibitively high, limiting the desire to use any terminal voltages V_Ter$_z$ for power consumption reduction or other reasons.

Although specific embodiments have been described and illustrated, the embodiments are not to be limited to the specific forms or arrangements of parts so described and illustrated. The described embodiments are to only be limited by the claims.

What is claimed:

1. An array of devices, comprising:
   each device within the array of devices being specified by a location (i,j) within the array of devices, wherein i is a row index ranging from 1 to N, and j is a column index ranging from 1 to M, wherein M is a positive integer greater than or equal to 2 and N is a positive integer;
   each device including a Vdd terminal and a Vss terminal, wherein the Vdd terminal has a higher potential than the Vss terminal;
   at least a first plurality of the devices in the array of devices, where each device in the first plurality of the devices further including at least one input terminal and at least one output terminal and Zmax number of V_Ter$_z$ terminals, where z is an index ranging from 1 to Zmax, where Zmax is a positive integer;
   wherein when N is greater than or equal to 2, then for at least a first majority of the devices in the array of devices, the Vss terminal of the device at location (i,j), for i=2:N, j=1:M, is connected to the Vdd terminal of the device at location (i−1,j), resulting in a potential difference between the Vdd terminal and the Vss terminal of at least the first majority of the devices in the array of devices to be a substantially same voltage VDD;
   wherein for at least a second majority of the devices in the array of devices, the potential of the Vss terminal of each device at any location (i,j+1) of the array of devices is generated to be higher than the potential of the Vss terminal for another device at location (i,j) by a voltage X$_j$, for i=1:N, j=1:(M−1); and
   wherein VDD is substantially same as a potential difference between the Vdd terminal and the Vss terminal of at least one device of the first plurality of the devices in the array of devices, and a sum of all X$_j$ voltages for j=1:(M−1) is greater than or substantially same as VDD/2.

2. The array of devices of claim 1, wherein at least one of a V_Ter$_z$ terminal or an input terminal or an output terminal of a first device in the first plurality of the devices is connected to at least one of a Vss terminal or a Vdd terminal or an input terminal or an output terminal of a second device in the first plurality of the devices, and at least one of a V_Ter$_z$ terminal or an input terminal or an output terminal of the second device is connected to at least one of a Vss terminal or a Vdd terminal or an input terminal or an output terminal of at least one of the first device or a different device in the array of devices.

3. The array of devices of claim 1, wherein voltages X$_j$ for j=1:(M−1) are generated by at least (M−1) voltage dropping elements (R$_j$), wherein each of the voltage dropping elements (R$_j$) comprise an Rx1 terminal and an Rx2 terminal, and wherein each of the voltage dropping elements (R$_j$) facilitating a potential drop across the Rx1 terminal and the Rx2 terminal are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

4. The array of devices of claim 3, wherein for j=1:M−1, the Rx1 terminal of voltage dropping element R$_j$ is connected to the Vss terminal of the device at location (1,j+1) in the array of devices, and the Rx2 terminal of R$_j$ is connected to the Vss terminal of one of the j devices at j locations in row 1 from (1,1) to (1,j) in the array of devices.

5. The array of devices of claim 3, wherein for j=1:M−1, the Rx1 terminal and Rx2 terminal of the voltage dropping element (R$_j$) are connected to the Vss terminals of the devices at locations (1,j+1) and (1,j) in the array of devices.

6. The array of devices of claim 3 wherein for j=1:M−1, the Rx1 terminal and Rx2 terminal of the voltage dropping elements R$_j$ are connected to the Vss terminals of the devices at locations (1,j+1) and (1,1) in the array of devices.

7. The array of devices of claim 3, wherein for j=1:M−1, the Rx2 terminal of voltage dropping element R$_j$ is connected to the Vdd terminal of the device at location (N,j) in the array of devices, and the Rx1 terminal of R$_j$ is connected to the Vdd terminal of one of the (M−j) devices at (M−j) locations in row N from (N,j+1) to (N,M) in the array of devices.

8. The array of devices of claim 3, wherein the Vss terminal of the device at location (1,1) is connected to a lower potential of two terminals of a power supply and the Vdd terminal of the device at location (N,M) is connected to a higher potential of the two terminals of the power supply, wherein for j=1:M−1 the Rx1 and Rx2 terminals of the voltage dropping elements (R$_j$) are connected to the Vdd terminals of the devices at locations (N,j+1) and (N,j) in the array of devices.

9. The array of devices of claim 3, wherein the Vss terminal of the device at location (1,1) is connected to a lower potential of two terminals of a power supply and the Vdd terminal of the device at location (N,M) is connected to a higher potential of the two terminals of the power supply; wherein for j=1:M−1 the Rx1 and Rx2 terminals of the voltage dropping elements (R$_j$) are connected to the Vdd terminals of the devices at locations (N,j) and (N,M) in the array of devices.

10. The array of devices of claim 1, wherein for at least the first plurality of the devices in the array of devices, a desired potential difference of terminal V_Ter$_z$ to terminal Vss in the device with terminal V_Ter$_z$ is VDTer$_z$, wherein each of (M−C(z)) voltages, (sum(X$_j$:X$_j$+C(z)−1) for j=1:(M−C(z))), is substantially same as min(VDD−VDTer$_z$, VDTer$_z$) for z=1:Zmax, where C(z) is a positive integer for z=1:Zmax.

11. The array of devices of claim 1, wherein for at least a third majority of the first plurality of the devices in the array of devices, for i=1:N and for j=1:M and for z=1:Zmax, when (VDD−VDTer$_z$) is less than VDTer$_z$, then when (j−C(z)) is greater than or equal to 1, then V_Ter$_z$ terminal of the device at location (i,j) is connected to the Vdd terminal of the device at location (i,j−C(z)) and when (j−C(z)) is less than 1, then V_Ter$_z$ terminal of the device at location (i,j) is connected to the Vss terminal of the device at location (i,j−C(z)+M), and when (VDD−VDTer$_z$) is greater than or equal to VDTer$_z$, then when (j+C(z)) is less than or equal to M, then V_Ter$_z$ terminal of the device at location (i,j) is connected to the Vss terminal of the device at location (i,j+C(z)) and when (j+C(z)) is greater than M, then V_Ter$_z$ terminal of the device at location (i,j) is connected to the Vdd terminal of the device at location (i,j+C(z)−M).

12. The array of devices of claim 1, wherein one of more of the devices are controllable by one or more external parameters or inputs, wherein changing the external parameters or inputs changes an impedance of the devices and the potential difference between the Vdd terminal and the Vss terminal of the one or more devices.

13. The array of devices of claim 12, wherein the external parameters or inputs comprise at least a clock frequency of operation of the one or more devices.

14. The array of devices of claim 1, wherein the array of devices comprises a second staggered voltage distribution by voltage $W_k$ in a $3^{rd}$ dimension specified by an index k;
wherein any location in the array specified as (i, j, k), with row index i ranging all integers from 1 to N, and $1^{st}$ column index j ranging all integers from 1 to M, and $2^{nd}$ column index ranging all integers from 1 to L, where L is a positive integer greater than or equal to 2;
wherein when N is greater than or equal to 2, then for at least the first majority of the devices in the array of devices, the Vss terminal of device at location (i,j,k), for i=2:N, is connected to the Vdd terminal of the device at location (i−1,j,k), thereby providing a substantially same voltage VDD between the Vdd terminal and the Vss terminal of at least the first majority of the devices in the array; and
wherein for at least the fourth majority of the devices in the array of devices, the potential of Vss terminal for device at any location (i,j+1,k) is generated to be higher than the potential for the Vss terminal for a device at location (i,j,k) by a voltage $X_j$, for i=1:N, j=1:(M−1), k=1:L; and
wherein for at least a fifth majority of the devices in the array of devices, the potential of the Vss terminal for a device at any location (i,j,k+1) is generated to be higher than the potential for the Vss terminal a device at location (i,j,k) by a voltage $W_k$, for i=1:N, j=1:M,k=1: (L−1).

15. The array of devices of claim 14, wherein one of more of the devices are controllable by one or more external parameters or inputs, wherein changing the external parameters or inputs changes an impedance of the devices and the potential difference between the Vdd terminal and the Vss terminal of the one or more devices.

16. The array of devices of claim 15, wherein the external parameters or inputs comprise at least a clock frequency of operation of the one or more devices.

17. The array of devices of claim 8, wherein for j=1:M−1, the Rx1 terminal and the Rx2 terminal of the additional voltage dropping element R2$_j$ are connected to the Vss terminals of the devices at locations (1,j+1) and (1,j) in the array of devices, wherein the additional voltage dropping elements R2$_j$ are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

18. The array of devices of claim 8, for j=1:M−1, the Rx1 terminal and the Rx2 terminal of the additional voltage dropping element R2$_j$ are connected to the Vss terminals of the devices at locations (1,j+1) and (1,1) in the array of devices, where the additional voltage dropping elements R2$_j$ are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

19. The array of devices of claim 9, for j=1:M−1, the Rx1 terminal and the Rx2 terminal of the additional voltage dropping element R2$_j$ are connected to the Vss terminals of the devices at locations (1,j+1) and (1,j) in the array of devices, where the additional voltage dropping elements R2$_j$ are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

20. The array of devices of claim 9, for j=1:M−1, the Rx1 terminal and the Rx2 terminal of the additional voltage dropping element R2$_j$ are connected to the Vss terminals of the devices at locations (1,j+1) and (1,1) in the array of devices, where the additional voltage dropping elements R2$_j$ are implemented by one or more of: a) a voltage battery, b) a voltage level shifting buffer, c) an apparatus having a function of a resistor, d) an actual resistor, e) a switched capacitor circuit that functionally behaves as a resistor, f) a PCB (printed circuit board) trace resistance, g) a routing wire resistance, h) resistance of one or more transistors or resistors.

21. The array of devices of claim 3, wherein one or more of the voltage dropping elements (Rj) are controllable by one or more external parameters or inputs to the voltage dropping elements, wherein changing the external parameters or inputs changes the potential difference across terminals of the one or more voltage dropping elements.

22. The array of devices of claim 20, wherein the one or more of the voltage dropping elements ($R_j$) and additional voltage dropping elements (R2$_j$) are controllable by one or more external parameters or inputs to the voltage dropping elements ($R_j$, R2$_j$) wherein changing the one or more external parameters or inputs changes the potential difference across terminals of the voltage dropping elements ($R_j$, R2$_j$).

* * * * *